(12) United States Patent
Whitney

(10) Patent No.: US 7,283,203 B2
(45) Date of Patent: Oct. 16, 2007

(54) ROLL PRINTER WITH DECOMPOSED RASTER SCAN AND X-Y DISTORTION CORRECTION

(76) Inventor: Theodore Robert Whitney, 6914 Canby Ave., 109, Reseda, CA (US) 91335

( * ) Notice: Subject to any disclaimer, the term of this patent is extended or adjusted under 35 U.S.C. 154(b) by 0 days.

(21) Appl. No.: 11/406,955

(22) Filed: Apr. 18, 2006

(65) Prior Publication Data
US 2006/0209277 A1  Sep. 21, 2006

Related U.S. Application Data

(62) Division of application No. 10/792,114, filed on Mar. 2, 2004, now Pat. No. 7,130,020.

(60) Provisional application No. 60/467,110, filed on Apr. 30, 2003.

(51) Int. Cl.
G03B 27/52 (2006.01)
G03B 27/54 (2006.01)

(52) U.S. Cl. .......................................... 355/55; 355/67

(58) Field of Classification Search ............ 355/53–55, 355/67, 40, 47; 250/548; 359/731, 733
See application file for complete search history.

(56) References Cited

U.S. PATENT DOCUMENTS

| | | |
|---|---|---|
| 3,748,015 A | 7/1973 | Offner |
| 3,821,763 A | 6/1974 | Scott |
| 3,884,573 A | 5/1975 | Franklin |
| 3,951,546 A | 4/1976 | Markle |
| 4,011,011 A | 3/1977 | Hemstreet |
| 4,068,947 A | 1/1978 | Buckley |
| 4,142,401 A | 3/1979 | Wilson |
| 4,171,870 A | 10/1979 | Bruning |
| 4,241,390 A | 12/1980 | Markle |
| 4,293,186 A | 10/1981 | Offner |
| 4,549,084 A | 10/1985 | Markle |
| 4,650,315 A | 3/1987 | Markle |
| 4,747,678 A * | 5/1988 | Shafer et al. ............... 359/366 |
| 4,779,966 A | 10/1988 | Friedman |
| 4,924,257 A | 5/1990 | Jain |

(Continued)

OTHER PUBLICATIONS

Abe Offner, "Annular Field Systems and the Future of Optical Microlithography", Optical Engineering, vol. 6, No. 4, Apr. 1987, pp. 294-299.

(Continued)

Primary Examiner—Henry Hung Nguyen

(57) ABSTRACT

A reflecting Offner-like optical system is described which is suitable for use in a photolithographic system in which the magnification is approximately 1 to 1, and where the format is flexible. The primary mirror is split into two halves, which are movable with respect to each other. Magnification is slightly changeable by moving the two halves of the split primary mirror forward and backward by slight amounts. The reflecting optical system is moved in a reciprocating manner across a nominally stationary photomask and an intermittently stationary flexible format, which includes a segment of a roll-to-roll web. The arctuate object and image are rotated 90 degrees by flat mirrors to enable efficient scan coverage as the entire mirror system shuttles back and forth across the mask and the web. Center to center distance between the object and the image fields is increased by the use of an aspheric secondary mirror.

8 Claims, 17 Drawing Sheets

U.S. PATENT DOCUMENTS

| | | |
|---|---|---|
| 4,933,714 A | 6/1990 | Buckley |
| 4,953,388 A | 9/1990 | Barada |
| 5,103,257 A | 4/1992 | Wijnasendts-van-Resandt |
| 5,204,535 A | 4/1993 | Mizutani |
| 5,221,975 A | 6/1993 | Kessler |
| 5,227,839 A | 7/1993 | Allen |
| 5,285,236 A | 2/1994 | Jain |
| 5,315,629 A | 5/1994 | Jewell et al. |
| 5,329,332 A | 7/1994 | Markle |
| 5,479,238 A | 12/1995 | Whitney |
| 5,530,516 A | 6/1996 | Sheets |
| 5,559,629 A | 9/1996 | Sheets |
| 5,585,972 A * | 12/1996 | Markle ............... 359/732 |
| 5,652,645 A | 7/1997 | Jain |
| 5,710,619 A | 1/1998 | Jain |
| 5,729,331 A | 3/1998 | Tanaka et al. |
| 5,739,964 A | 4/1998 | Allen |
| 5,781,346 A | 7/1998 | Allen et al. |
| 6,018,383 A | 1/2000 | Dunn et al. |
| 6,081,578 A * | 6/2000 | Braat ............... 378/34 |
| 6,084,706 A * | 7/2000 | Tamkin et al. ............ 359/366 |
| 6,304,315 B2 | 10/2001 | Kessler |
| 6,664,121 B2 | 12/2003 | Grodnensky et al. |
| 6,752,915 B2 | 6/2004 | Arao et al. |
| 6,809,888 B1 | 10/2004 | Markle |
| 6,815,259 B2 | 11/2004 | Ninomiya et al. |
| 6,970,592 B2 | 11/2005 | Fujimoto et al. |
| 6,994,897 B2 | 2/2006 | Durocher et al. |
| 2004/0263429 A1 | 12/2004 | Harmed et al. |
| 2005/0087578 A1 | 4/2005 | Jackson |
| 2005/0099615 A1 | 5/2005 | Ishil |
| 2005/0105071 A1 | 5/2005 | Ishil |
| 2005/0237505 A1 | 10/2005 | Harned et al. |

OTHER PUBLICATIONS

David M. Williamson, "Evolution of Ring Field Systems in Microlithography", SPIE, vol. 3482, pp. 369-376.

Jose M. Sasian, "New Development in the Design of Ring-Field Projection Cameras for EUV Lithography: Passive Pupil Correction", SPIE, vol. 3482, pp. 658-663.

Jose M. Sasian, "Annular Surfaces in Annular Field Systems", Optical Engineering, vol. 36, No. 12, pp. 3401-3403.

Akiyoshi Suzuki, "Complete Analysis of a Two-Mirror Unit Magnification System, Part 1", Applied Optics., vol. 22, No. 24, Dec. 15, 1983, pp. 3943-3949.

Akiyoshi Suzuki, "Complete Analysis of a Two-Mirro Unit Magnification System. Part 2", Applied Optics, vol. 22, No. 24, Dec. 15, 1983, pp. 3950-3956.

J. Dyson, "Unit Magnification Optical System without Seidel Aberrations", Journal of Optical Society of America, Vol. 49, No. 7, Jul. 1959, pp. 713-716.

T. R. Whitney, "A Large Flat Panel Printer", paper presented to Image Science & Technology Annual Conference, May 19-24, 1996, Minneapplis, MN, 5 pages.

\* cited by examiner

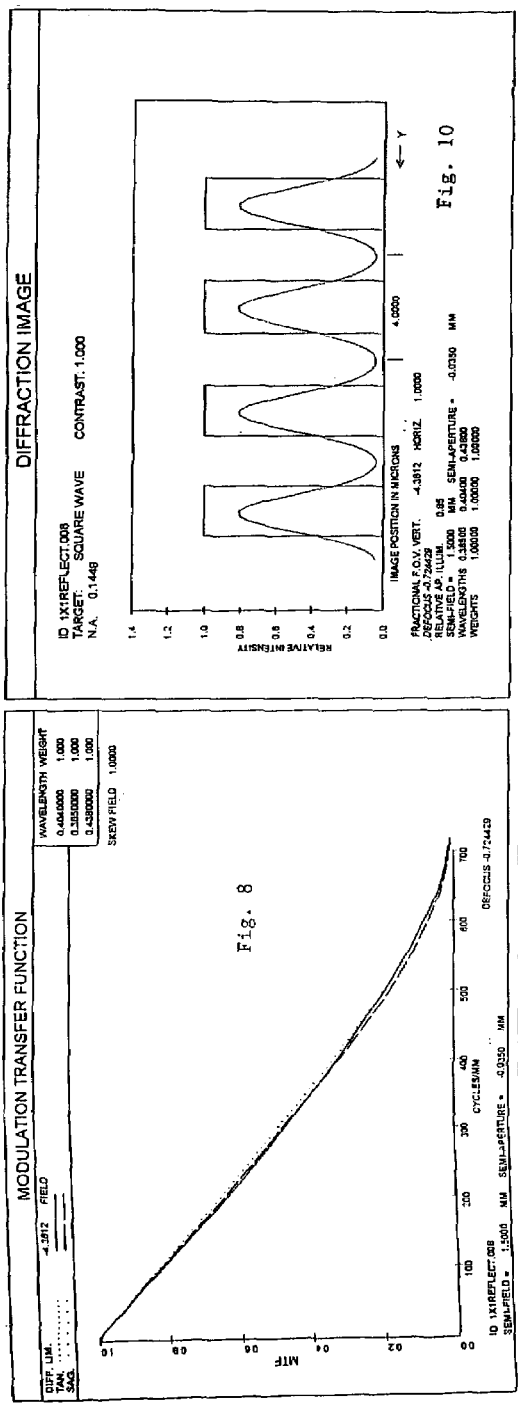
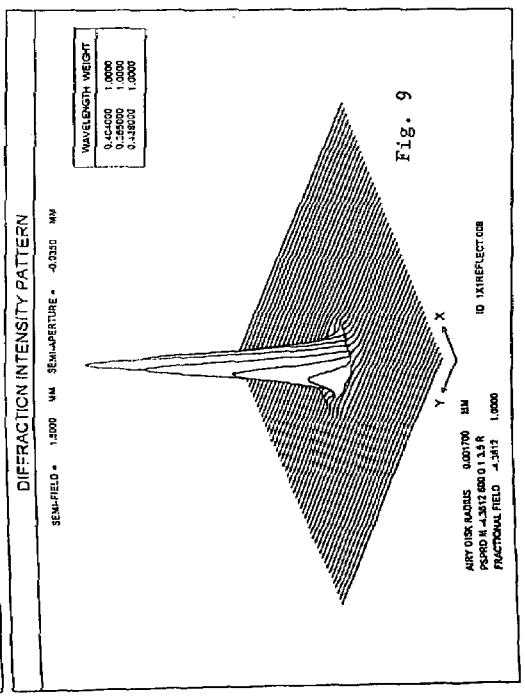
Fig. 8
Fig. 9
Fig. 10

ROLL PRINTER WITH DECOMPOSED RASTER SCAN AND X-Y DISTORTION CORRECTION

REFERENCE TO PRIOR APPLICATION

This U.S. application is a division of prior U.S. patent application Ser. No. 10/792,114, filed Mar. 2, 2004 now U.S. Pat. No. 7,130,020, which application claims priority to provisional application Ser. No. 60/467,110 filed Apr. 30, 2003, the disclosures of which are expressly incorporated herein by reference.

FIELD OF THE INVENTION

This invention relates to the manufacture of semiconductor circuits, display panels, photochemically produced parts and the like on flexible material, and more specifically to a roll-to-roll machine which optically copies an object field onto an image field at unity magnification.

PRIOR ART

In semiconductor photolithography, in flat panel manufacture and in the manufacture of photochemically produced parts, the creation of images of very fine resolution and at the same time of very large area is of great importance. For example 1-2 micron image resolution is being demanded over fields or panel sizes as large as 24 inches, and 0.1 micron resolution is required over fields as large as 25 mm. Such images contain from 2-500,000 resolved points across in one dimension, and are thus far out of reach of a stationary camera lens, however complex, which resolves—at a maximum—something like 50,000 points in each direction. The classical solution to this problem is to scan a small optical field of fine resolution across a larger format in some sort of ordered overlapping raster pattern. Images are transferred from a master object, usually a photomask, onto a format which is to become a semiconductor circuit, a display panel, a group of photochemically produced parts, etc. Because the final format is much larger than the instantaneous field of the optical system, the master and the format are scanned together in a raster pattern relative to the optical field of the transfer optics. This is done by introducing relative movements between the master and format in one assembly and the optical image transfer system in another. Thus, for example an 18"×24" format image at 1-2 micron resolution can be produced by scanning a lens field 80 mm in diameter across the 18", stepping downward and scanning backward, stepping down and scanning across, and repeating the raster scan until the entire area is covered. In order to be able to move the master image and the format relative to the lens, and have the deposited image come out in the correct orientation, the image must be erect, whereas a simple imaging lens produces an inverted image.

In semiconductor photolithography high resolution scanning optical systems producing an erect 1:1 transfer of images have been used for many years. The image transfer has been made from master artwork, usually a glass or quartz photomask, onto a flat glass or silicon substrate—and more recently onto a flexible substrate, for example photoresist coated mylar or thin stainless steel. An early optical system applied to this purpose was the Offner system (Ref. 2), used in the Micralign projection aligners (Refs. 5, 6, 7, 10, 11, 12, 15). This optical system comprised two mirrors, a large concave primary and a convex secondary, the system working at a large decenter distance. Imagery at a 1:1 conjugate ratio is very good in a ring field of radius equal to the system decenter. Along this arc the image is substantially aberration-free except for higher order astigmatism. These systems are distinguished by having a well-resolved field which is shaped in a narrow arc centered around the system centerline. In conjunction with the two spheres, Offner also used flat mirrors to erect the image. A second well-known 1:1 optical system used for photolithography is the Wynne-Dyson system (Refs. 1, 9, 22, 23). These systems are also distinguished by having small, relatively high resolution fields and erect images (produced by a prism system).

In exposure applications similar to photolithography the advantage of using mirror optics is clear. In order to take full advantage of available exposure sources, such as mercury or metal-halide arcs, the imaging optics must be able to function well over a broad range of wavelengths. Achromatic systems (corrected for two wavelengths) are not sufficiently well corrected. Apochromatic systems (three or more wavelengths) are bulky and expensive. Mirror systems, however, are corrected for all wavelengths, and hence insensitive to the color of the broadband source.

A series of photolithographic instruments have been built using 1:1 lens transfer optics (Refs. 14, 19, 26) in which the master photomask and the format are held rigid relative to each other and that assembly is moved in a raster pattern through the object and image fields of the stationary 1:1 lens optics, thus in successive stripes covering the entire field of the format. In this process the fields are overlapped, from one successive scan to the next, and the field stop is chosen to be of a shape which causes the exposure in the overlapped region to be even. This overlapping scan design was employed by Franklin, Ref. 4, using both a diamond and a curved field stop, by Jain using hexagons, Refs. 14, 19, and by Whitney, Ref. 21, using a field stop whose side edges resemble a hexagon shape but which are adjusted inward or outward according to the measured illumination intensity as required to produce a very even field. The stationary optical transfer assembly adopted in the designs of references 14, 19, and 26 used lenses because in the mechanical configuration which the inventor adopted there was not room simultaneously to use a large primary mirror and to move a large photomask and format. These and other designs where the optics are held stationary have also been adapted to print on continuous rolls of flexible format material where the web is fed through the machine and advanced frame by frame. In between panels the roll is advanced one frame, each advance taking place after the mask and format assembly (carrying the part of the web between take-up rollers) has completed a raster pattern to scan the master mask over the optical field of the optical transfer assembly. However, because the optical transfer assembly is held stationary and the mask and format assembly is moved in two dimensions to complete a raster scan, the web is necessarily twisted, to complete this series of motions.

Others have adapted the Wynne-Dyson optical design to a machine arrangement which raster scans a nearly vertical format at high resolution, holding the optical system stationary and moving the photomask and format through its fields (Refs. 22, 23). A laser scanner has been built by Tamkin et al, Ref. 31, that uses an adaptation of the Offner design in which the primary mirror is split into two halves, but the separate mirrors are not moved relative to each other to control magnification. Other similar machines were built by Dunn and others (Ref. 30) and by Kessler and others, (Ref. 32). All of these designs, as far as is known, employ stationary transfer optics.

It is inherently more difficult mechanically to introduce two orthogonal motions into a single moving assembly than it is to split the two motions, introducing the cross-scan by the motion of one assembly and the intermittent motion, between scans, into the orthogonal member. If the motion components are split each is a straight line movement and the expense associated with X-Y stage motion is avoided. The drives are simplified and mechanical errors associated with X-Y stage droop are avoided.

Display panels and semiconductor wafers change their dimensions during processing. Flexible plastic substrates are much more dimensionally unstable, in that they are sensitive to humidity as well as to heat and process variables. Photolithography of display panels and semiconductor circuitry requires that many layers be laid down in exact registry with one another, the registration requirement from layer to layer being considerably smaller than the amount of distortion expected to be encountered in the substrate or web material. Thus it has been recognized that, when flexible substrates are used, the effects of distortion, usually of unpredictable amounts and in unpredictable directions, must be overcome if precise overlay registration requirements are to be met. To counter these effects several groups have introduced a slight relative motion into the photomask/format assembly and/or a slight magnification change into the transfer optics before or during the scanning process. Jain (Ref. 19) introduced a technique of periodically realigning the photomask and the format. Whitney (Ref. 21) introduced a relative motion of the mask relative to the format during the course of the scan pass to counter distortion during each single pass in a large proximity printer. Sheets et al introduced a magnification change stage comprising a very weak telephoto telescope with adjustable distances between the lenses (Ref. 23) to counter scan-to-scan distortion. This adjustment was made prior to the start of scanning and was not dynamic nor automatic. Jain et al (Ref. 26) and Allen et al (Ref.28 and 29) both introduced schemes for changing magnification during scanning by changing lens or prism element separations. Both systems involved stationary lens optical transfer assemblies.

The requirement for mass production of display panels on flexible material makes overlay accuracy from layer to layer a necessary requirement. Thus the ability to introduce both Dynamic Distortion Control and slightly variable magnification during the course of completing the raster scanning pattern is a necessary feature.

Another characteristic of erect image optical transfer assemblies where the photomask and the format are co-planar (cf. Ref. 19) is their error sensitivity to a relative rotation in yaw (around an axis mutually perpendicular to the line connecting the centers of the optical fields and to the photomask plane). If this geometry is used, it is very necessary that this sensitivity be eliminated or reduced to a very small value.

When a large photomask and a large web are laid side by side and incorporated mechanically into a single assembly, and if that assembly is moved back and forth and intermittently forward across the fields of a stationary optical system to produce the raster scanning pattern, then this scanning pattern requires that the web be twisted in ways which will tend to introduce a component of unwanted distortion. It is desirable that the machine arrangement be such that the web is fed straight through from one reel to the other without any twisting.

Multiple processes may be sequenced within the same physical machine, e.g. a first pattern which comprises a writing stage, treated in detail in the description which follows, may be followed by a development stage, a laser annealing stage, etc. It may be followed by provision to record another complementary pattern on the back of the same web substrate, with a requirement for equal precision in the location and resolution of the pattern. Transport of the web through these subsequent stages should be carried out without twisting the web, if distortion is to be minimized.

SUMMARY OF THE INVENTION

This invention is a new design of a precision one-to-one transfer printing machine which prints high resolution images of 18"×24" or more from a rigid photomask to a flexible roll-to-roll web format. The long dimension is not limited to 24" in this design but may be any length, like 40" or 48" if desired. The 18" dimension may be increased by scaling the assembly.

The invention comprises a new machine layout, including an optical transfer assembly which shuttles reciprocally with respect to an intermittently stationary photomask and format assembly to provide in combination a raster scan, also providing slightly adjustable magnification, a reciprocally moving illumination system, and a photomask articulated within its frame to introduce slight relative motions in two dimensions. This combination of elements involving the moving optical system and the intermittently stationary photomask and format solves the notable problems of previous designs in a simple manner. There is plenty of room to use a large reflective achromatic optical system and still scan a large format, the two-dimensional effects of distortion are removed, the introduction of yaw angle error is avoided, and the web is fed through the machine without twisting or stress. It is designed to produces high-resolution images (better than 2 micron least dimension) everywhere on the format and better than 1 micron layer to layer overlay accuracy. The optics are completely achromatic and the system is therefore insensitive to the wavelength composition of the light which is supplied by the illuminator.

The photomask and the vacuum platen are coplanar facing downward and during exposure vacuum holds a portion of the web tightly to the platen. The photomask and platen comprise a single assembly which moves forward incrementally during exposure, and which remains stationary during the time that the optical transfer assembly shuttles reciprocally across or back beneath them. After each optics scan pass is completed, in either the plus or minus X direction, the photomask/platen assembly moves forward the width of one scan pass, again remaining stationary while the return optics pass is completed. The combination of these two movements, the reciprocating movement of the optical transfer assembly and the intermittent movement of the photomask/platen assembly, together comprise a raster scan covering the entire 18" width and 24" length (or longer) of the image format.

Both the optical transfer assembly and the photomask/platen assembly are supported on air/vacuum bearings and ride on stone planes, one motion orthogonal to the other. The photomask/platen assembly has side guide bearings of the air/vacuum type, riding on a vertical stone face. The optical transfer assembly is retained into a straight-line motion by two sets of opposed air bearings guiding on opposite sides of a smooth vertical plate.

The precision with which orthogonality of the transferred pattern is maintained is taken from an initial orthogonal adjustment of the vertical edge of the top portion of the stone base structure guiding the photomask/platen assembly, with the vertical plate guiding the optical transfer assembly cross-motion.

Autofocus is maintained by two proximity sensor gages and two servoed lifters, one under the object field and one under the image field. Optionally the photomask is carried in a vacuum support frame that helps to maintain the image surface flat, countering sag due to gravity. However, since focus is performed independently on each field, and corrected independently on each field, the object end of the apparatus can ride over a considerable residual curvature in the photomask without image degradation or change in magnification. For a similar reason, the image end of the optical train can also tolerate considerable variation in the level of the format plane.

The web is carried straight through the machine, from roll to roll, without twisting. A portion of the web is held firmly against the vacuum platen as it is exposed during a frame. It is advanced one swath width (~80 mm. allowing for slight overlap) between scans, carried intermittently forward with the photomask/platen assembly, until the entire raster scan is complete. The vacuum then releases, the web advances a complete frame on the roll-to-roll drive, the platen returns to its starting position, and the vacuum platen seizes the next section of the web for the start of the next frame.

The emergent end of the fiber bundle carrying the illuminator light is reciprocally scanned, in synchronism with the optical transfer assembly movement during a panel exposure.

When a second or subsequent layer is being exposed, in registry with the first, before the first raster scan of the second exposure, the optical transfer assembly makes a single pass across the format, with the actinic exposure light occluded. At the start and end of this pass the positions of fiducials located on both the near and far top corners of the existing format image are measured relative to corresponding photomask fiducials, together with the positions of two next fiducials along the near and far sides of the first layer format image, again measured relative to corresponding fiducials on the photomask. The differences between corresponding readings and their predicted positions (which are errors or distortions in the existing format image) are used by the control computer to compute both the Dynamic Distortion Correction component of the photomask relative motion and the slight magnification adjustment which is applied to the optical transfer assembly from pass to pass during the exposure scan.

The optical transfer assembly is constructed so that first and third spherical mirrors comprise two symmetrical optical elements, side by side and arranged to be nominally concentric with each other. Upon command, they move up to ±20 microns backward and forward relative to each other along the axis of the system, supported on flex joints, supplying a change in system magnification up to at least $1\times10^{-3}$, as may be required for distortion compensation.

BRIEF DESCRIPTION OF THE DRAWINGS

A better understanding of the invention may be had by reference to the following description taken in conjunction with the following drawings in which:

FIG. 8 is a modulation transfer function of the optical system;

FIG. 9 is a point spread function of the optical system;

FIG. 10 is a graph of the system response to 2 micron lines and spaces;

DESCRIPTION OF THE PREFERRED EMBODIMENT

The preferred embodiment of this invention is an optical machine for the processing of display screens, multilayer circuits constructed on flexible material and the like. It comprises a series of assemblies which operate together under the control of a multiaxis controller, to produce large exposed patterns or panels in a semi-automatic manner. The separate assemblies will be described separately followed by a description of the way in which they work together.

Figure 1:
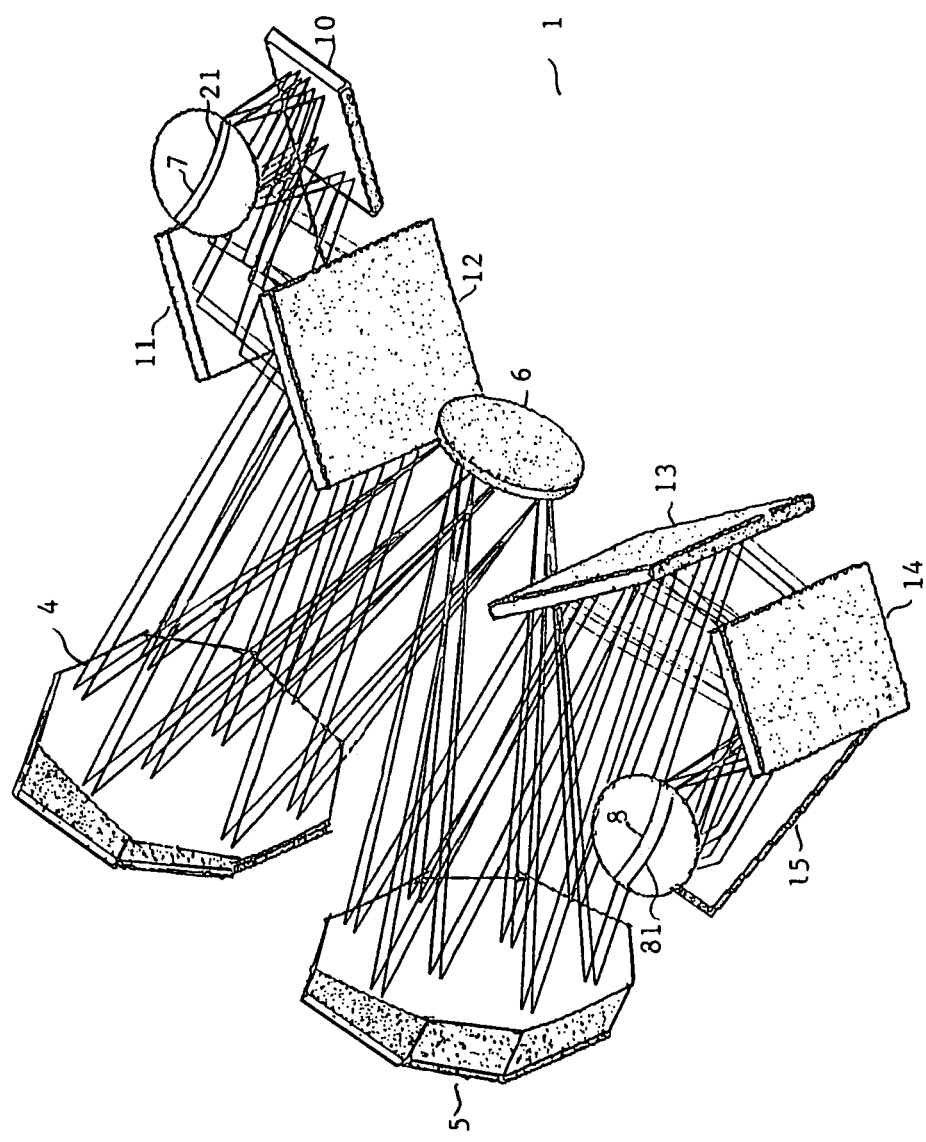
FIG. 1 is an oblique view of the optical transfer optics.

The optical transfer assembly 1, FIGS. 1-5, which images detail from the photomask 2 to the format 3 is an all-reflecting erecting configuration similar to the arrangement first described by Offner, Ref. 2 except that the primary concave mirror is composed of two controllably moveable smaller mirrors, the secondary mirror is aspheric, and the erecting mirrors are differently and more advantageously arranged. The two primary mirrors are concave spheres 4, 5 and one, the convex secondary, is aspheric, 6. FIG. 1 shows an oblique view of the optical arrangement of the optical transfer assembly, as seen from above. The same assembly is shown in top view, front view, side view and rear view in FIG. 2-5, together with the surrounding air/vacuum support bearings 26, 27, 28, opposed air guide bearings, 30, 31 and bearing guide 32, mounted on the stone base structure 29.

Figure 2:
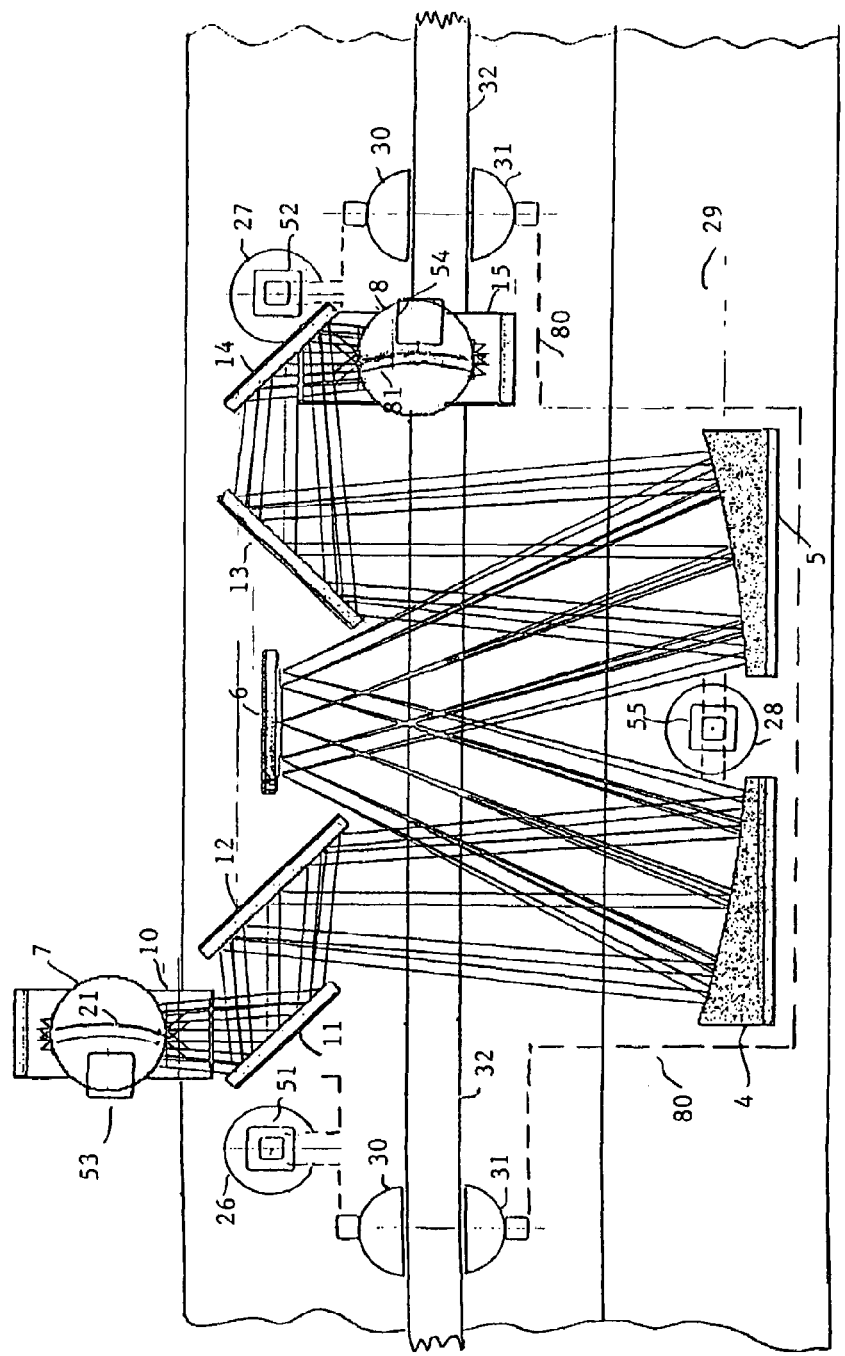
FIG. 2 is a top view of the optical transfer assembly and guide bearing subassembly.
Figure 6:
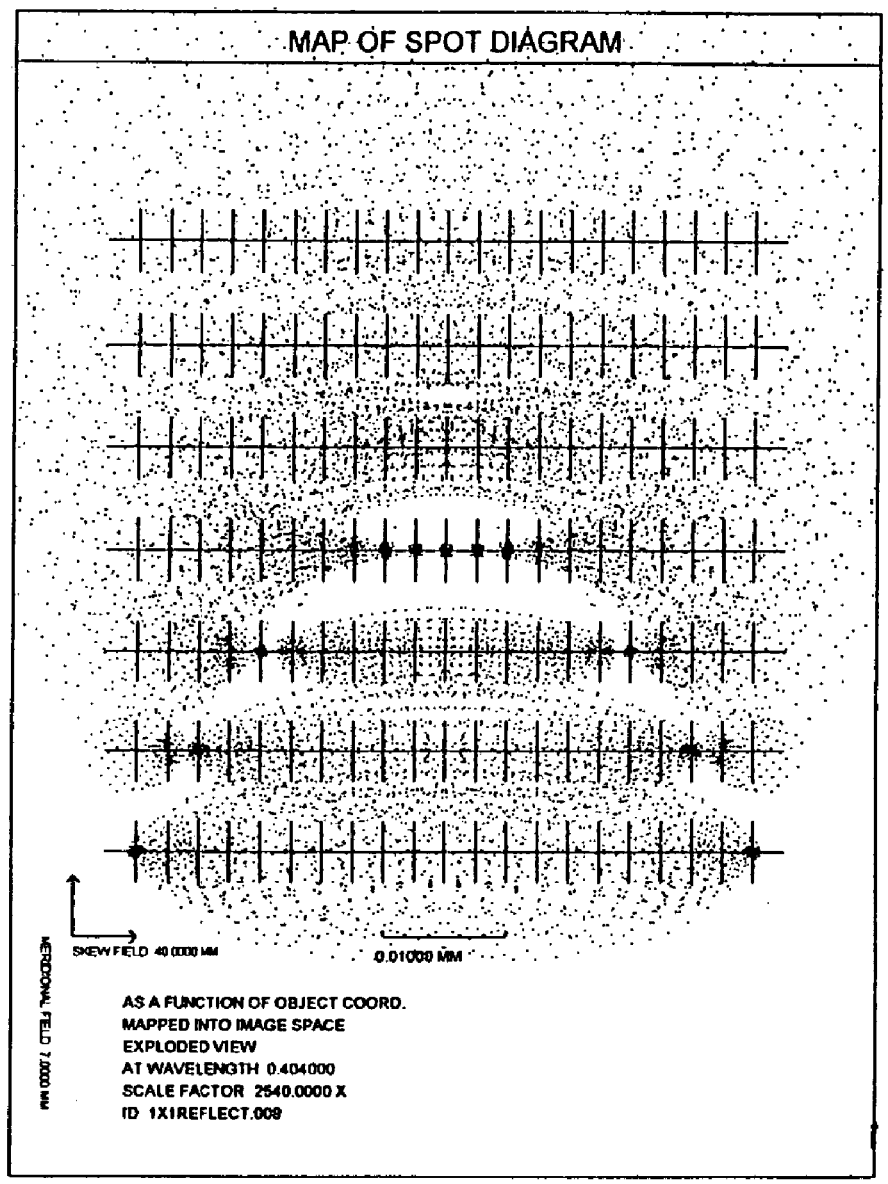
FIG. 6 is a diagram of the optical resolution over the 80 mm. field showing the arc of good focus.
Figure 7:
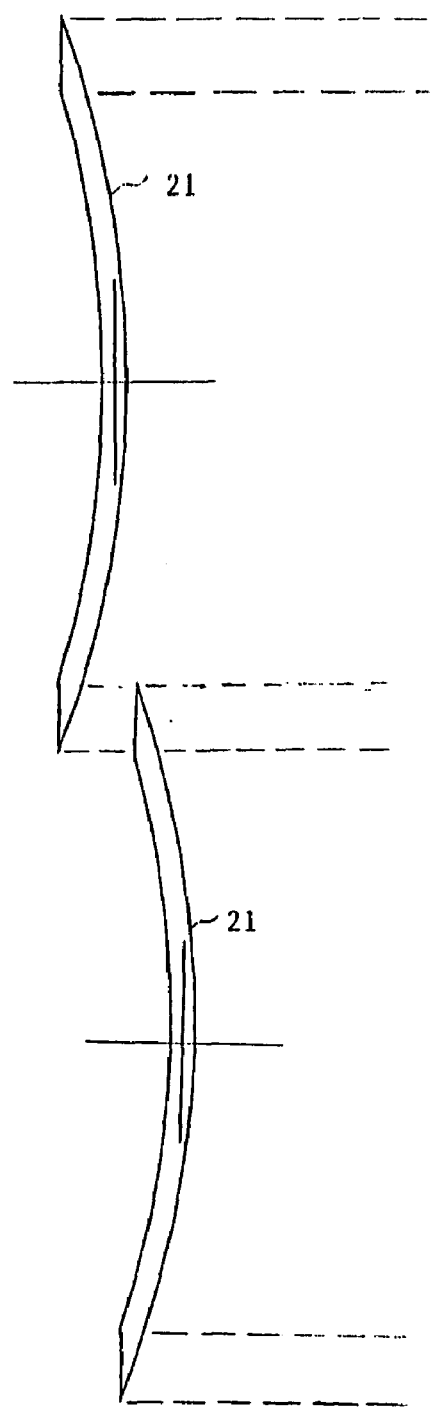
FIG. 7 is a field stop which admits only the object points lying within the arc of good focus, FIG. 6.
Figure 11:
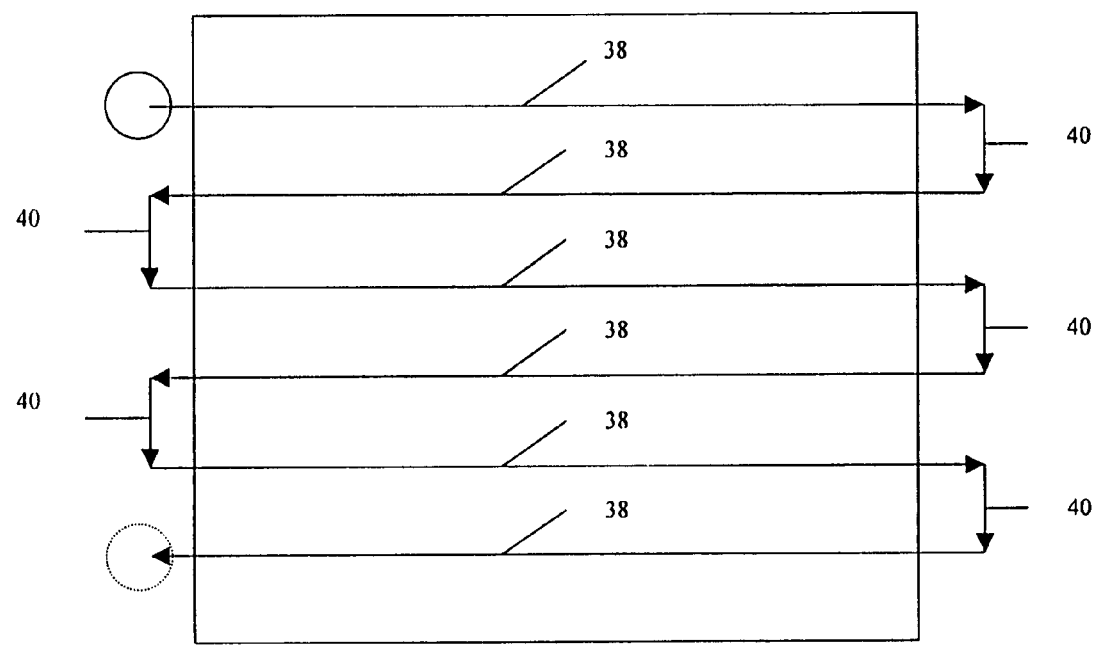
FIG. 11 is a diagram of the raster scanning pattern shown as the composition of the motions of two assemblies.

The design, as used here, is optimized to provide a resolution of about 1.5µ over an arc shaped object field 21 and image field 81, which is 80 mm high by approximately 3 mm wide, FIG. 2. The centers of the fields, 7, 8, are located approximately 19.5" apart and a well-corrected arc field of object points is projected down from the photomask at 7 and up onto the format located at 8. The quality of spot imagery within this arc is shown as the highly resolved arc of image points in FIG. 6. Within the arc shaped field stop 21, FIG. 7, this optical system has substantially diffraction limited imagery, as shown by the modulation transfer function for the central points, FIG. 8, and the point spread function, FIG. 9. It has the ability to completely resolve 2 micron lines and spaces, as is graphically illustrated in FIG. 10. The arctuate field stop 21, FIG. 7, is 80 mm. high by 3 mm. wide. It is tapered on each end, and on each pass of the optical transfer assembly across the format the scanned field overlaps the previous field by one half of the tapered section. Thus exposure is smoothed out between scans and banding is avoided Two versions of the optical system are presented. The simplest comprises a concave sphere 4, a convex sphere 9, and a concave sphere 5 in series (plus erecting mirrors). The sphere centers and curvatures are arranged in a form resembling the configuration originally described by Offner, but the primary mirror of this system is made up of two parts, 4, 5, which are slightly movable axially, with respect to each other. The optical constants of a typical all spherical example of this system are described completely in Table 1. In the second, preferred, embodiment, an example of which is described in Table 2, the central convex mirror at the system pupil is replaced by an aspheric mirror 6. This latter system is slightly faster. It is arranged to be considerably further off-axis, covers a much wider scanning field of view, and has its fields rotated 90 degrees for optimal mechanical scanning of the photomask and format. (see the scanning pattern, FIG. 11). This latter system (FIG. 1-5) takes a complex of six flat mirrors, three on the object side, 10, 11, 12, and three on the image side, 13, 14, 15, to rotate the field 90 degrees and erect the image at the same time. The system operates at about f/4.05 in the meridian along the scanning direction, about f/4.85 in the meridian along the arctuate field.

Offner described a system of four plane erecting mirrors. His mirrors, however, bend inward (see also Ref. 31 for another such system), decreasing the distance between field centers. The erecting mirror system 10-15, and the increased decenter employed in the aspheric design presented in this patent specification (Table 2) brings the fields outward so that their centers are separated by more than the width of the web, while the field is simultaneously rotated to cover the maximum web area per pass. In the aspheric system the optics are 122 mm. off center and, because of the additional offset caused by optimal positioning of the mirrors, the distance between the object and image field centerlines is 19.3 inches.

Because the fields 7, 8 are 19.3 inches apart in the reciprocal-scan direction, the width of the web that can be covered is at least 18", and because the arctuate field 21 is 80 mm. from top to bottom, slightly more than a 24" format can be covered in eight reciprocal raster passes.

Figure 12:
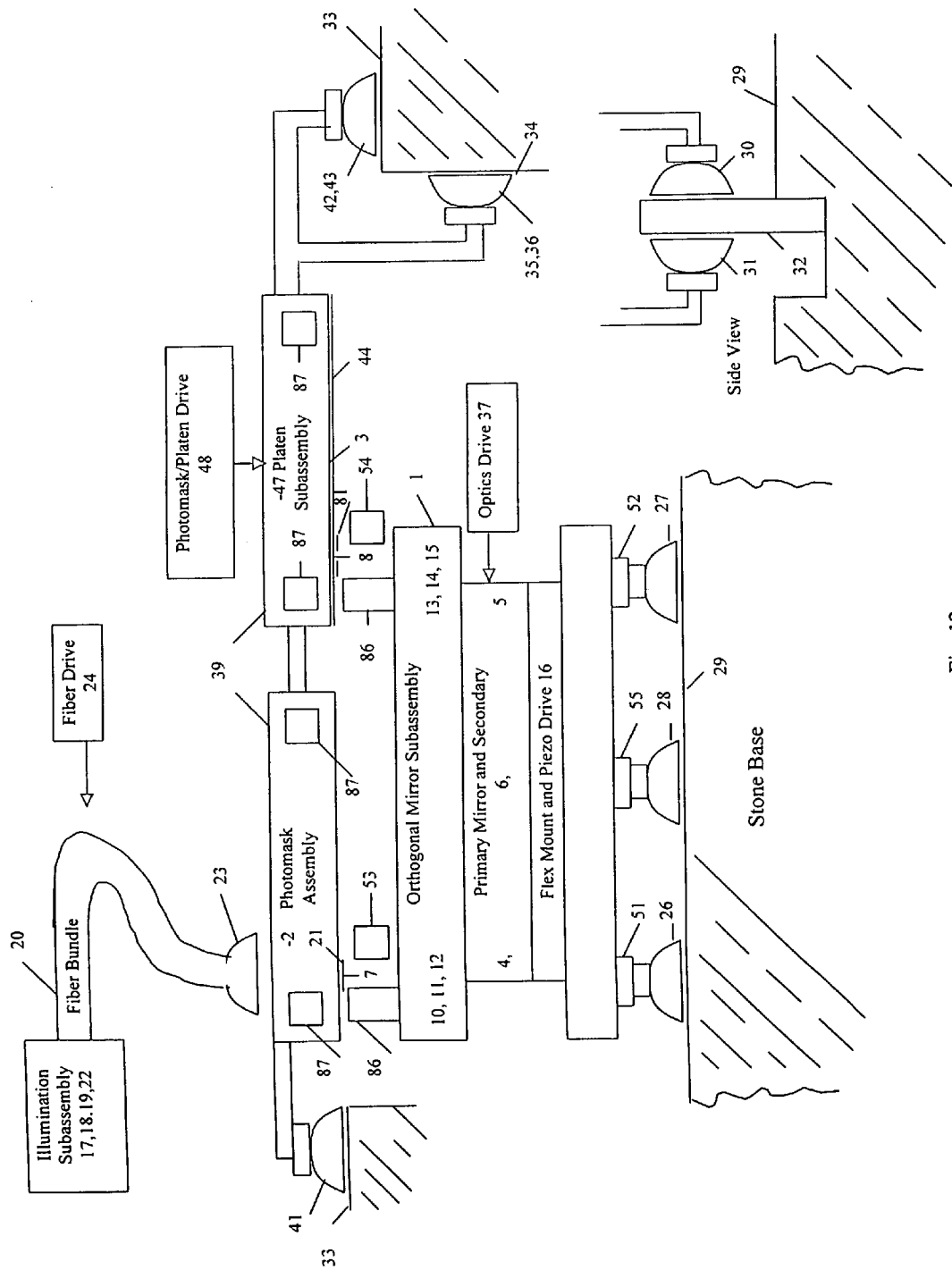
FIG. 12 is a schematic diagram of the photomask/vacuum platen assembly; in combination with the optical transfer assembly and the illumination assembly.

The two concave primary mirrors 4, 5 are used because the system is required to change magnification by up to one part in $10^3$ to compensate for possible Y direction format distortion. These two elements are flex mounted and provided with a piezo or micro-stepper drive 16 (FIG. 12) so that they may be driven reciprocally axially up to ±20μ, one forward, the other back. This reciprocal motion produces the necessary magnification change without any significant image degradation. When one mirror is moved inward and the other outward, one conjugate of the system shortens, the other lengthens by the same amount and the magnification changes by the ratio of conjugate distances. Small spherical mirrors are among the least expensive precision optical elements. Thus the two smaller primaries are less expensive and, of course, lighter than a single larger mirror.

The imaging optical system of concave and convex mirrors 4, 5, 6 is made as one subassembly mounted and adjusted together, and the six erecting mirrors 10-15 comprise a second subassembly. Thus the mirrors with optical power are mounted (and tested) together, the erecting mirrors are mounted together and checked for orthogonality, and the two subassemblies are then fixed with respect to each other.

To facilitate calibration of the autofocus and initial focusing, the last flat mirrors, 10, 15 on both the object and image sides are made as dichroics, permitting one to look through them, and to view the object or image surface through the mirror plane in other than actinic light.

Figure 15:
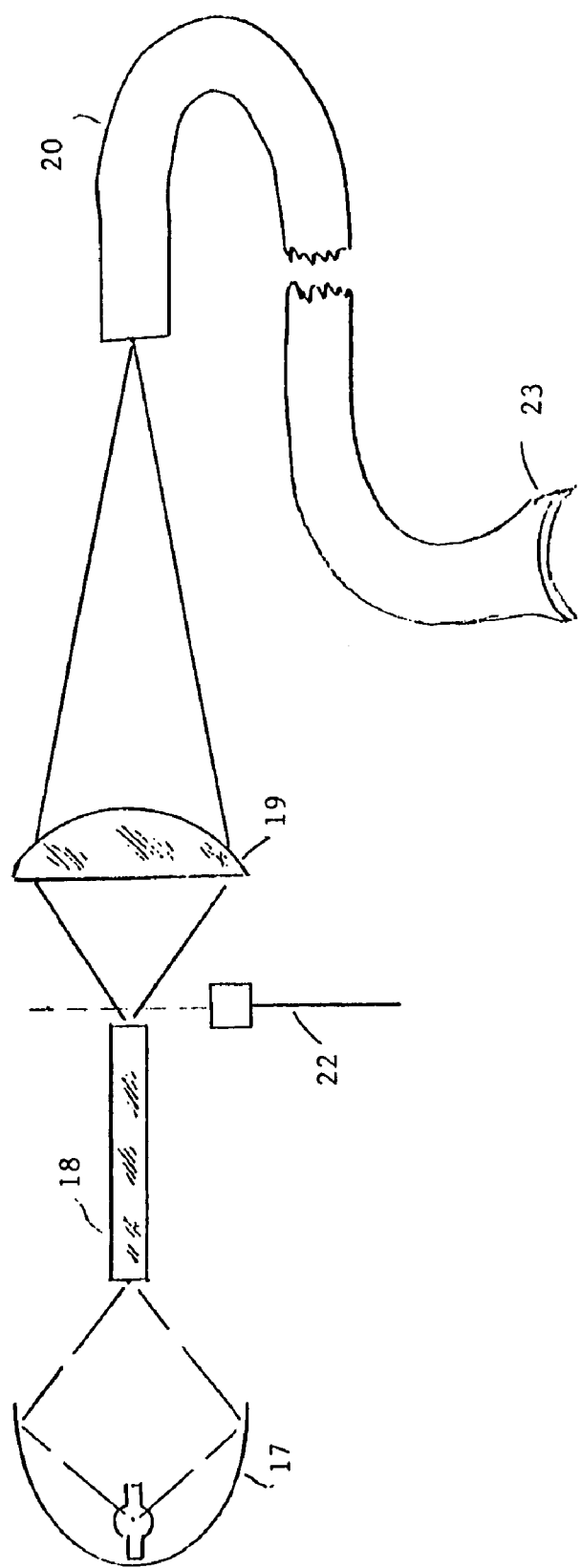
FIG. 15 is a schematic drawing of the illumination system.

The preferred illuminator arrangement is shown in FIG. 15. The illumination source 17 is typically an arc source, as for example the Ushio SMH UVI 200 watt Emarc lamp and elliptical reflector system, made by Ushio America of Irvine, Calif., or another lamp/reflector assembly of the same series up to 600 watts. These are all mercury enhanced metal halide lamps mounted in an elliptical reflector. Their reflected energy is concentrated into a spot in front of the reflector with an angularity of f/1. Each has an average lifetime of 1500 hours. Another lamp and reflector system that can be used is the long life Hamamatsu 575 watt metal-halide lamp L5431 and reflector system, which has an average lifetime of 3000 hours.

An integrator rod 18 (FIG. 15) is placed so that its entrance face is located at the front spot focus, collecting a good portion of the light. The integrator rod is a solid-state light tunnel, typically a bar of fused quartz of rectangular cross-section with all six of its sides polished. Such rods are supplied by Ariel Optics, Inc. of Ontario, N.Y. The function of the rod is to take a cone of irregularly distributed light in at one end, totally internally reflect each ray several times off the four longer sides and put out a cone of light at the other end which is evened out spatially over the emergent face. The sides of the rod are all parallel to each other, and consequently, the reflections which a ray undergoes passing through the rod all occur at equal angles. There is no growth or shrinkage in the f/# of the light beam in its passage through the rod. If a beam goes in at f/1 it will emerge at f/1. However, a beam that went in with a hot spot in the center or some other uneven distribution will be radially inverted several times and will emerge quite evenly distributed.

The radiation cone emergent from the integrating rod 18 will be at f/1, and the transfer optics accept f/3.5. Therefore the f/1 cone must be transformed into an f/3.5 cone by reimaging, using a transfer lens 19 having conjugate distances in the ratio of 1/3.5. The entrance end of the fiber bundle 20 is placed at the image of the emergent face of the integrator rod, formed by the transfer lens. A properly chosen fiber bundle has no trouble accepting and passing f/3.5 light, which is required in the example system.

The cross-sectional aspect of the fiber bundle 20 is circular at the source end, emerging in an arc shape 23 matching the arctuate field 21 (FIG. 7) at the photomask end. The fiber arrangement within the fiber bundle is randomized, further contributing to the even distribution of light over the field. The lamp and reflector, the integrator rod, the transfer lens and the entrant face of the fiber bundle are stationary. Intermediate between the entrance to the fiber bundle and the exit there is a loop of fiber arranged to flex easily and to reach across the format. The emergent portion of the fiber bundle is fixed in an assembly 24 that is driven in conjunction with the optical transfer assembly 1 through the cross-scan portion of the raster pattern. Precision is not important in this drive, and there is no yaw angle sensitivity.

A fiber bundle is not 100% efficient, since it is comprised of individual clad fibers whose cross-sections are circular. The cladding takes up some room and there are voids between the fibers. Overall, the packing efficiency of such a well-made fiber bundle is about 80%. It has an additional slight attenuation due to absorption of the quartz, and of course accepts energy only up to the numerical aperture for which it is constructed.

An alternate arrangement for the illuminator, delivering slightly more exposure energy, comprises a doped mercury line source and reflector subassembly, focused onto a similar incoherent quartz fiber bundle. Such a source and reflector emits well above 100 watts/inch of useable exposure energy and slightly more hot plasma is exposed to the optical collecting system. A source of this type, with its power supply, can be procured from Accurate Arc of Van Nuys, Calif.

Either type of source discussed above is adjustable in intensity by as much as 50%, by changing the power supply input voltages. Thus exposure is held constant as the lamp ages, or exposure can be adjusted to suit the chosen throughput speed. Fan cooling is required for either system.

In either system, a reflecting shutter 22 is provided, swinging into the beam just before the exterior focus of the arc, and just before the radiation enters the integrating rod or fiber bundle. This shutter provides a means of shunting radiation to the side when the system is in an idle mode.

Because the imaging optics are entirely reflective, the system is wavelength insensitive, and many other light sources may be considered. Among these are excimer lasers, RF Fusion sources and high pressure mercury arc lamps. The operating source and wavelength are selected to furnish actinic radiation suitable to satisfy the requirements of different combinations of sensitive material and exposure conditions at the format.

The optical transfer assembly 1 (FIG. 1-5) is carried on three air/vacuum aerostatic bearings 26, 27, 28 riding on the smooth surface of a horizontal stone base plate 29. Two of the support bearings are located one 26 directly under the object plane 7 and one 27 directly under the image plane 8. The third support bearing 28, is located at the rear of the optical assembly, underneath a point mid-way between the two sections of the primary mirror, forming a triangular support with the first two.

The bearings are preferably of types made by Dover Instrument Company of Massachusetts or by New Way Machine Components, Inc of Aston Pa. Such air/vacuum bearings have a flying height of perhaps 3-5 microns, a distance which is held quite constant by the balance between the pressure of the air flowing out from an outside ring (or a porous bottom surface) and the restoration force of vacuum drawn on an inner ring. The two forces balance, maintaining the bearing and the weight that it is supporting at a constant height. The bearings are "aerostatic" which means that they float at their adjusted height even when they are not moving sideways. They will maintain their correct height during the optical transfer assembly turnaround and, because of their stiffness, there will be almost no interval of adjustment and recovery. Typically the compliance of air/vacuum bearings in compression is between 2.5 and $5 \times 10^5$ lbs/inch of deflection, and the typical vacuum preload of the air/vacuum type bearings is 25 inches of mercury. Each bearing consumes less than 2 cubic feet/hour of clean dry air, supplied at 60-80 lbs/in$^2$.

Figure 3:
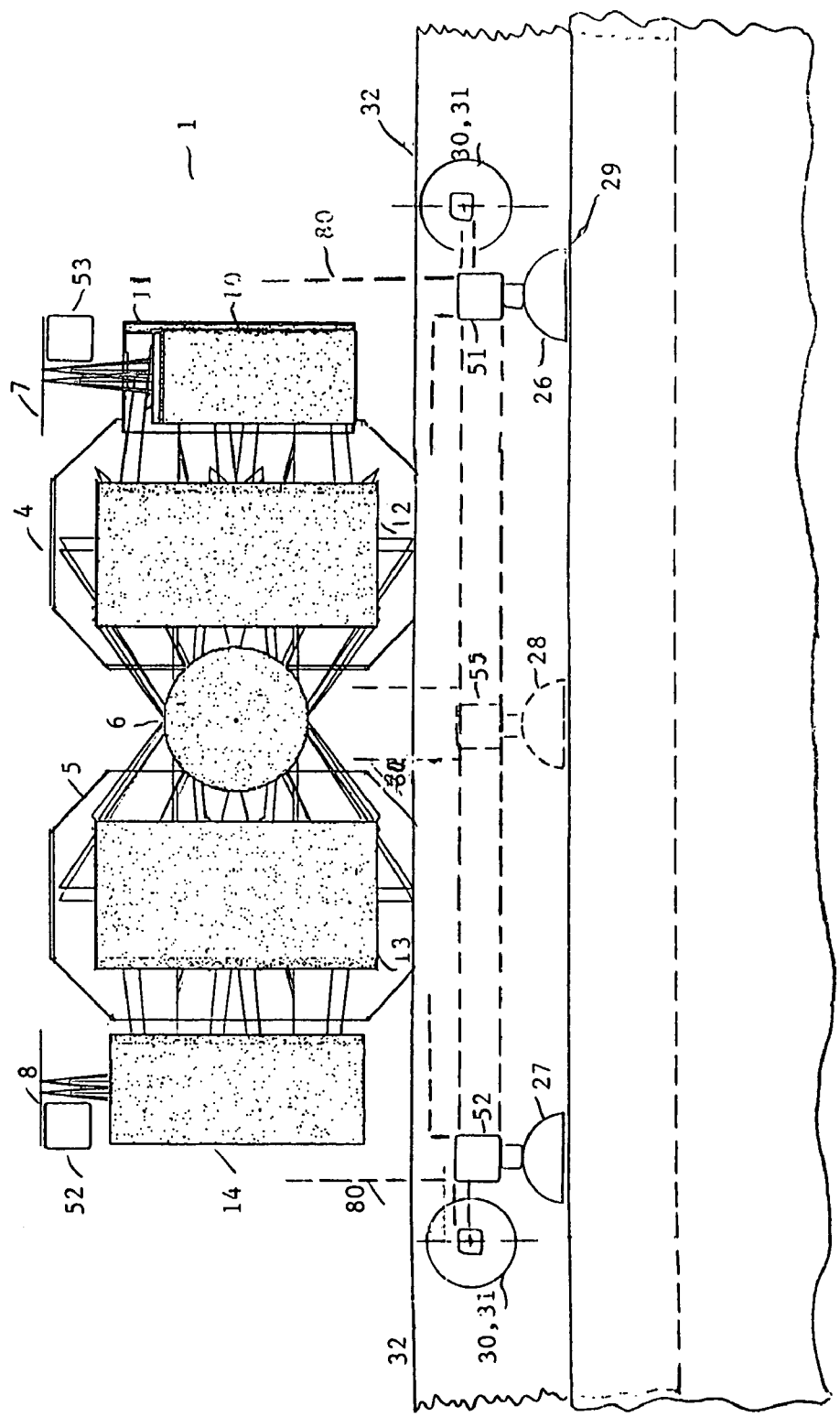
FIG. 3 is a front view of the optical transfer assembly and guide bearing subassembly.
Figure 4:
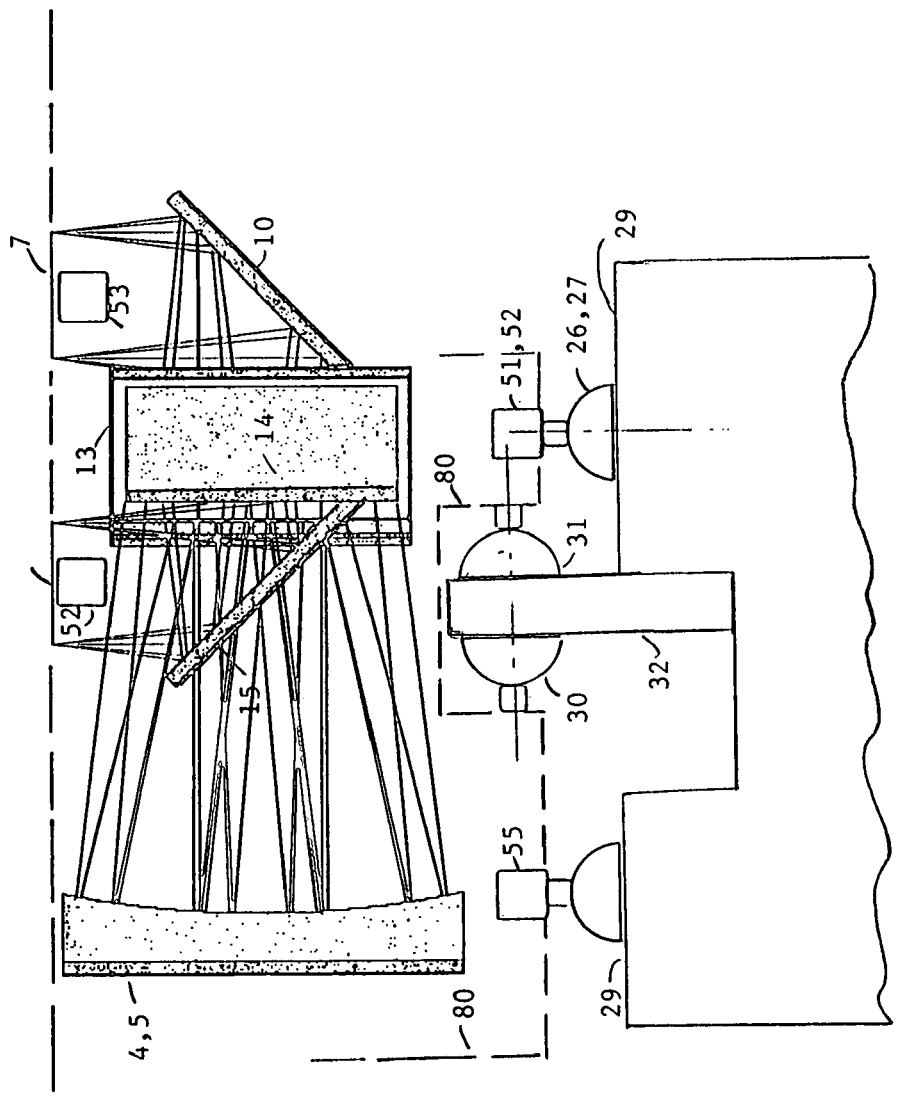
FIG. 4 is a side view of the optical transfer assembly showing it in relationship to the photomask/format fields of view, the stone base structure, the air bearing supports and opposed air guide bearings.
Figure 5:
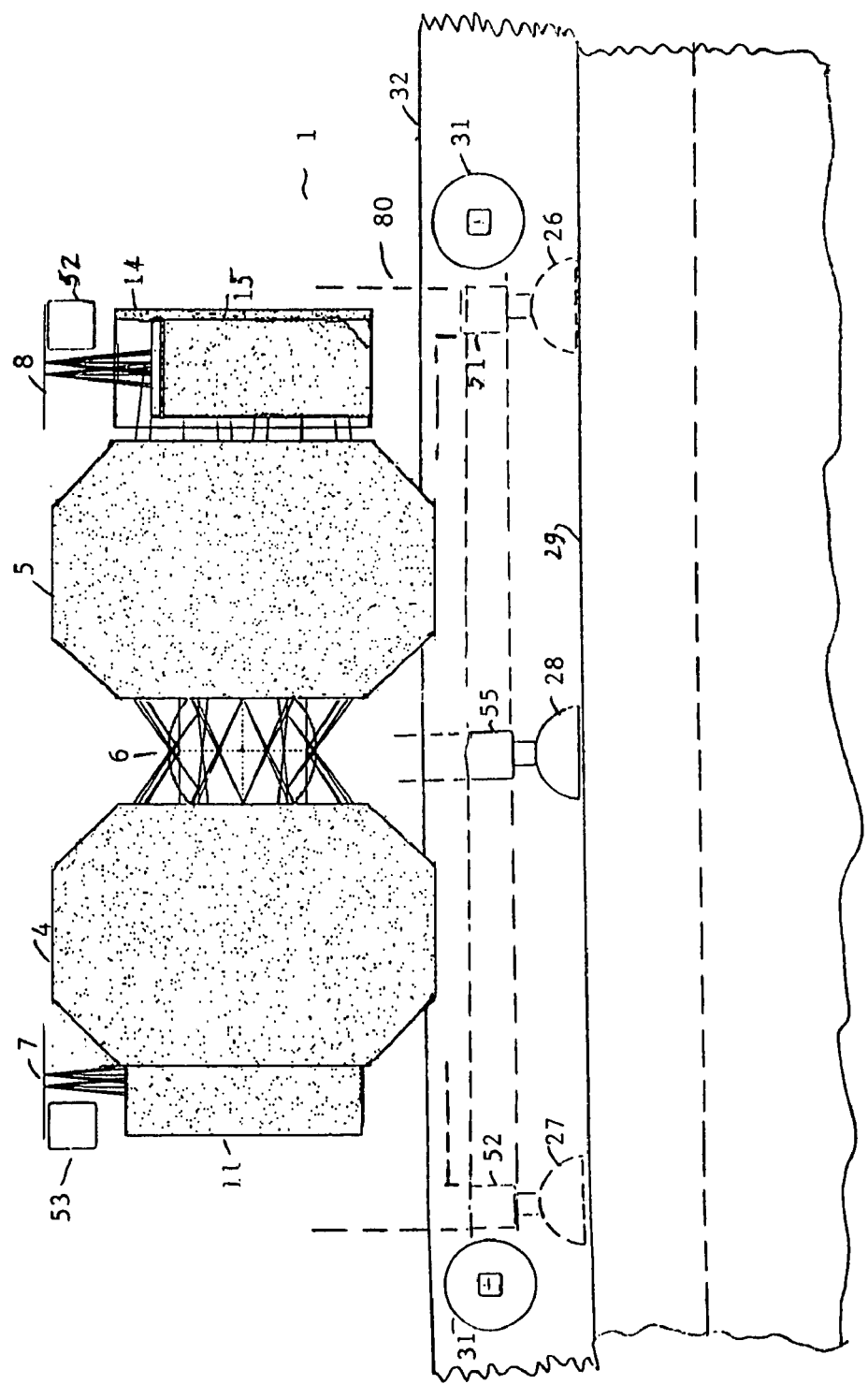
FIG. 5 is a rear view of the optical transfer assembly, the support bearings and the guide bearing subassembly.

The reciprocal motion of the optical transfer assembly is retained in a very precise straight line by the restraining force of two sets of opposed aerostatic air bearings 30, 31, referencing on either side of a smooth vertical guide plate, 32, which is attached to an internal vertical wall of the stone base structure 29, FIGS. 2 and 3. These bearings each have a stiffness in compression of about $2.5 \times 10^5$ lbs/inch of deflection at 5 microns of flying height, and any attempt of the optical transfer assembly cross-motion to depart from a straight-line path is met by immediate resistance of a large and increasing restoring force. Opposed air bearings are obtained from the same sources as are the air/vacuum type bearings. Because of the opposing forces, they also float when the assembly is at rest.

The lower part of the stone base structure 29 (FIG. 2-5), is flat and extends about 45 inches in the cross-scan direction, about 20 inches, back to front. An internal face is also finished perpendicular, and serves as a reference mounting face for the flat smooth guide plate 32 guiding the two sets of opposed air bearings 30, 31.

The upper portion of the stone base structure 33 serves as a support for the photomask/platen assembly 39. Its side perpendicular face 34 is finished flat and serves as a reference face for the photomask/platen assembly side-guide air/vacuum bearings 35, 36. Because of their vacuum preload they cling very well to a smooth vertical face, and operate at a constant standoff distance from that surface.

The optical transfer drive assembly 37, (FIG. 12), is preferably a cable or band drive. It is arranged to pull the optical transfer assembly 1 (FIG. 1-5), in a reciprocating straight-line pattern 38 (FIG. 11), across the short direction of the panel (across the web). Then, after the photomask/platen assembly 39 moves one raster width 40 in the direction along the web, the optical transfer drive assembly 37 pulls the optical transfer assembly backwards, in successive reciprocating scans covering the entire format as the photomask/platen assembly advances.

The constant portion of the optical transfer drive assembly speed profile 38 (FIG. 11) in the cross-scan direction is adjustable up or down in speed. In one embodiment it may typically be 10 cm/sec, a probable maximum around 17 cm/sec. This speed is held nearly constant across the scan, but there is no need for extreme precision in this drive, and there is no need for extreme accelerations at the ends of the stroke. Speed variations within the exposed field only affect exposure density, which has considerable latitude. This motion lends itself well to a cable or band drive 37, two bands being fixed to points on opposite sides of the optical transfer assembly projecting through the center of gravity and the center of percussion. Energy may be stored on turn-around, using a dashpot or bumper-spring system.

The photomask/platen assembly 39 (FIG. 12) similarly rides on three aerostatic air/vacuum bearings 41, 42, 43 upon a portion of the stone block base structure 33, aligned and attached to the lower stone block 29 that supports the optical transfer assembly. It also has two side air/vacuum bearings 35, 36 taking position from the flat, smooth vertical face 34 of the upper stone block 33. As the photomask/platen assembly increments along, these side guide bearings assure that the intermittent motion of the assembly will be carried out in a precise straight line.

Figure 13:
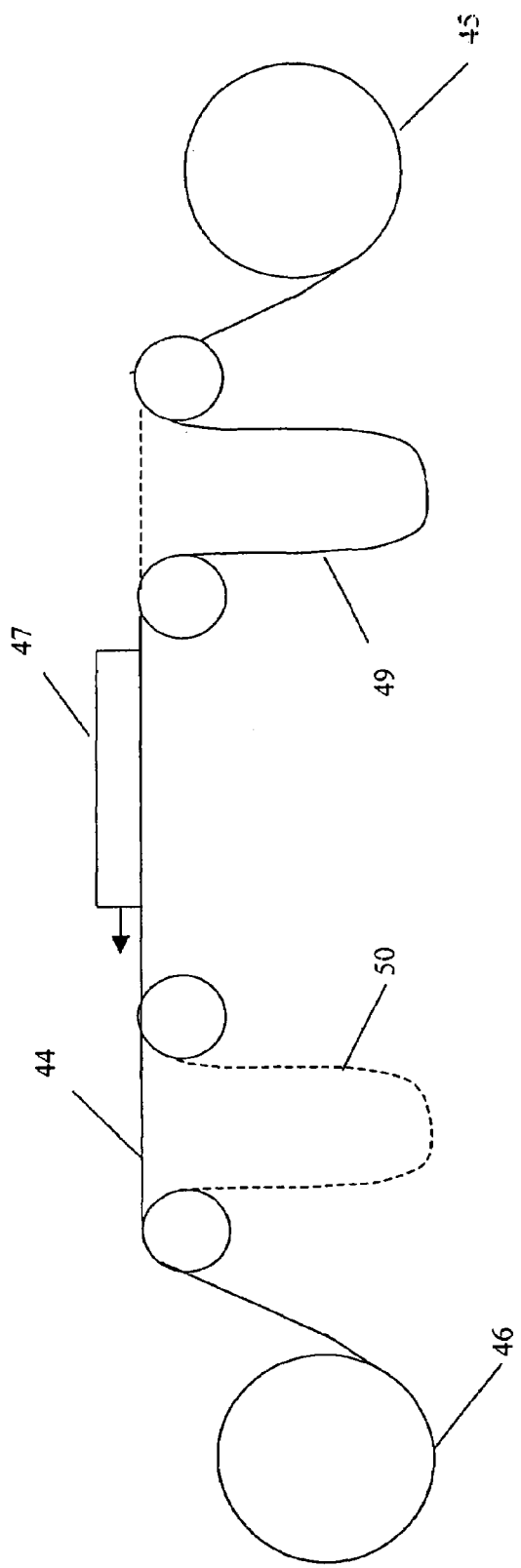
FIG. 13 is a schematic drawing of the roll-to-roll feed in relationship to the vacuum platen.

The photosensitive-coated web 44 is threaded through the machine, from feed roller 45 to take-up roller 46 (FIG. 13), passing across the lower surface of the vacuum platen 47.

Immediately before the start of scanning a new panel, the vacuum platen sucks the web up into firm contact, so that throughout the frame the two move together.

The photomask/platen assembly 39 and the section of web that it grips are driven the width of one raster scan 40 (FIG. 11) in the short interval between reciprocating passes 38 of the optical transfer assembly 1 across the format. This intermittent forward movement 40 is about 80 mm. the height of the good field when an optical system such as the example given herein in Table 2 is in use. This intermittent yet fairly precise motion can best be accomplished using a lead screw and stepper motor in an open-loop drive 48.

After advancing one raster interval (about 80 mm), the photomask/platen assembly 39 then stops and remains stationary until the next pass of the optical transfer assembly 1 is completed. This intermittent forward motion is repeated eight times completing eight raster passes. After eight passes the photomask/platen assembly 39 has moved and carried the section of web 44 that it grips about 25.2 inches. The vacuum platen 47 then releases the web 44 and the photomask/platen assembly 39 returns to its starting position, while the web 44 advances a frame. At that point the vacuum platen again sucks the web down firmly, and is ready to repeat the cycle.

Reasonable precision is required in this platen advance to prevent banding in the exposure due to uneven overlap of the contiguous optical fields.

There must be a free loop of web material at least 26-30 inches long 49 (FIG. 13) existing at the feeder end of the platen at the start of a frame, and the first pass of raster scanning most conveniently starts at the take-up end of the frame. This free loop of web material will be transferred to the take-up end of the roll-to-roll assembly 50 as the photomask/platen assembly intermittently moves forward and the raster scan proceeds.

The geometrical squareness of the machine and of the pattern that it records depends upon the accuracy with which the vertical reference face 34 of the upper part of the stone base structure and the vertical optics guide plate 32 on the lower part of the stone base structure are lined up perpendicular to each other. To the degree that they are skewed, this skewness will be imparted to every pattern which the system writes. The recorded pattern is not degraded in any other major way by this error, so long as it is kept small.

Both the object field 7 and the image field 8 (FIG. 1-5) must be maintained in good focus throughout the optical pass. Directly above each of the two front air/vacuum bearings 26, 27 (FIG. 3, 4) supporting the optical transfer assembly, there is a servoed lifter, for example a piezo actuator or a microstepper 51, 52 that is capable of raising or lowering that side of the optical system by ±50µ. Each actuator does this in closed-loop response to sensor signals received from proximity gages 52, 53 directly above which monitor the distance between the optical transfer assembly 1 and the photomask object plane 7 on one side and the format image plane 8 on the other (FIG. 3). The third lifter 55, above the rear bearing 28, is slaved to the average of the other two lifters 51 and 52. The piezo lifters 51, 52, 55 can optionally be replaced by linear microstepper motors which have a least count of 0.1µ or better.

Figure 17:
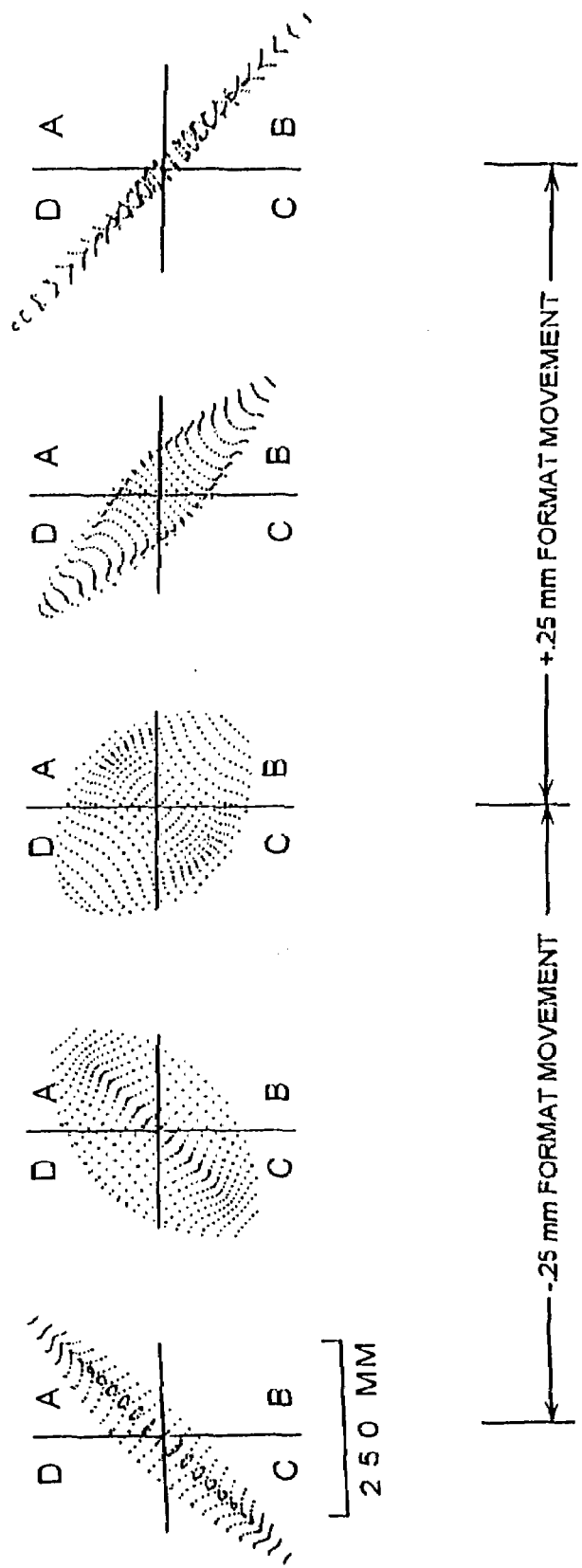
FIG. 17 is an illustration of a succession of astigmatic images obtained from an astigmatic gage moving through the position of good focus.
Figure 18:
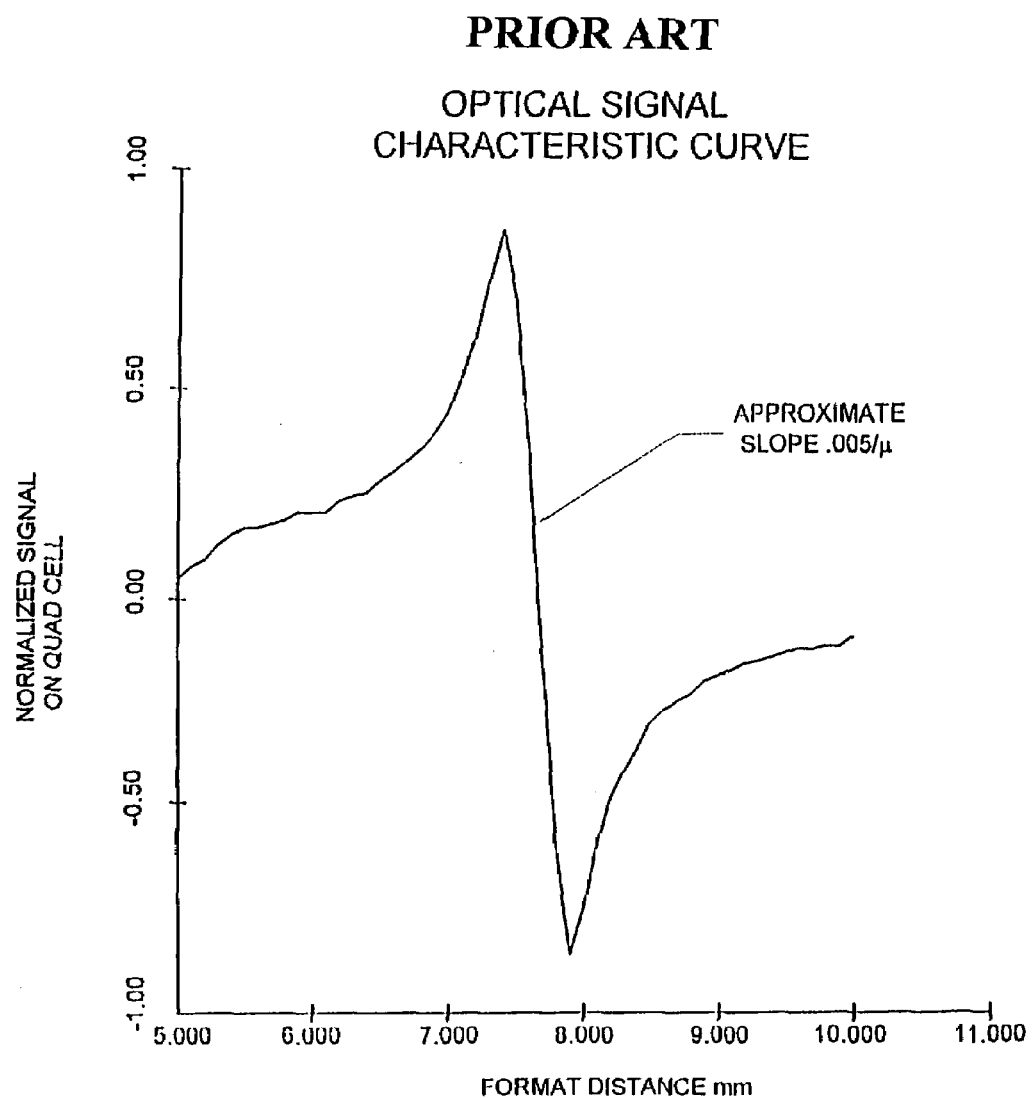
FIG. 18 illustrates a typical voltage response from an astigmatic gage as a function of focal distance.

A number of air proximity gages exist which can be employed for autofocus (Refs. 8, 16). Air gages operate at extremely low overpressure, a pressure regime where the airflow is essentially non-compressible, and the gage is, consequently, extremely rapid in response (Ref. 16). Typically response will exceed 100 Hz. This principle has been used for autofocus proximity sensing since the earliest wafer steppers. Alternatively laser triangulation gages are offered commercially which are sufficiently fast and accurate for this purpose, and astigmatic gages are available which are more than sufficiently fast and accurate to maintain this focus. FIGS. 17 and 18 illustrate the astigmatic image and the operating precision of one such astigmatic gage. In FIG. 17 the five spot distributions show changing ray patterns when the format distance changes. The quadrant detector in the gage and its circuit sensitively picks up the change in image aspect, by continuously solving the fraction $(A+C)-(B+D)/(A+B+C+D)$. The denominator normalizes the result so that the device is insensitive to format reflectivity. FIG. 18 shows the computed optical signal response curve for the proximity detector design TESTASTG.006.

The autofocus system needs to be preset to a correct focal position, with the conjugates of the optical transfer assembly set to approximately equal length, so that the magnification is very close to one. This adjustment is performed grossly by placing a test object in the photomask object plane, and directly observing an in-focus image of that object in the image plane, superimposed upon another dimensionally identical version of that object. Slight out of focus does not matter in this test, since the optical transfer optical system is designed to be telecentric. A calibrated series of test exposures is run at slightly different magnifications and focal settings, first evaluated using a CCD camera, then with an SEM. A central magnification and optimum focal setting are chosen. The focal setting is the center position that the air gages attempt to maintain thereafter. As subsequent layers build up the format thickness the focal position is changed suitably to compensate for the new image level. Initial focusing instrumentation similar to that described by Markle, Ref. 11, can also be used to set the zero positions of the autofocus sensor gages.

Figure 19:
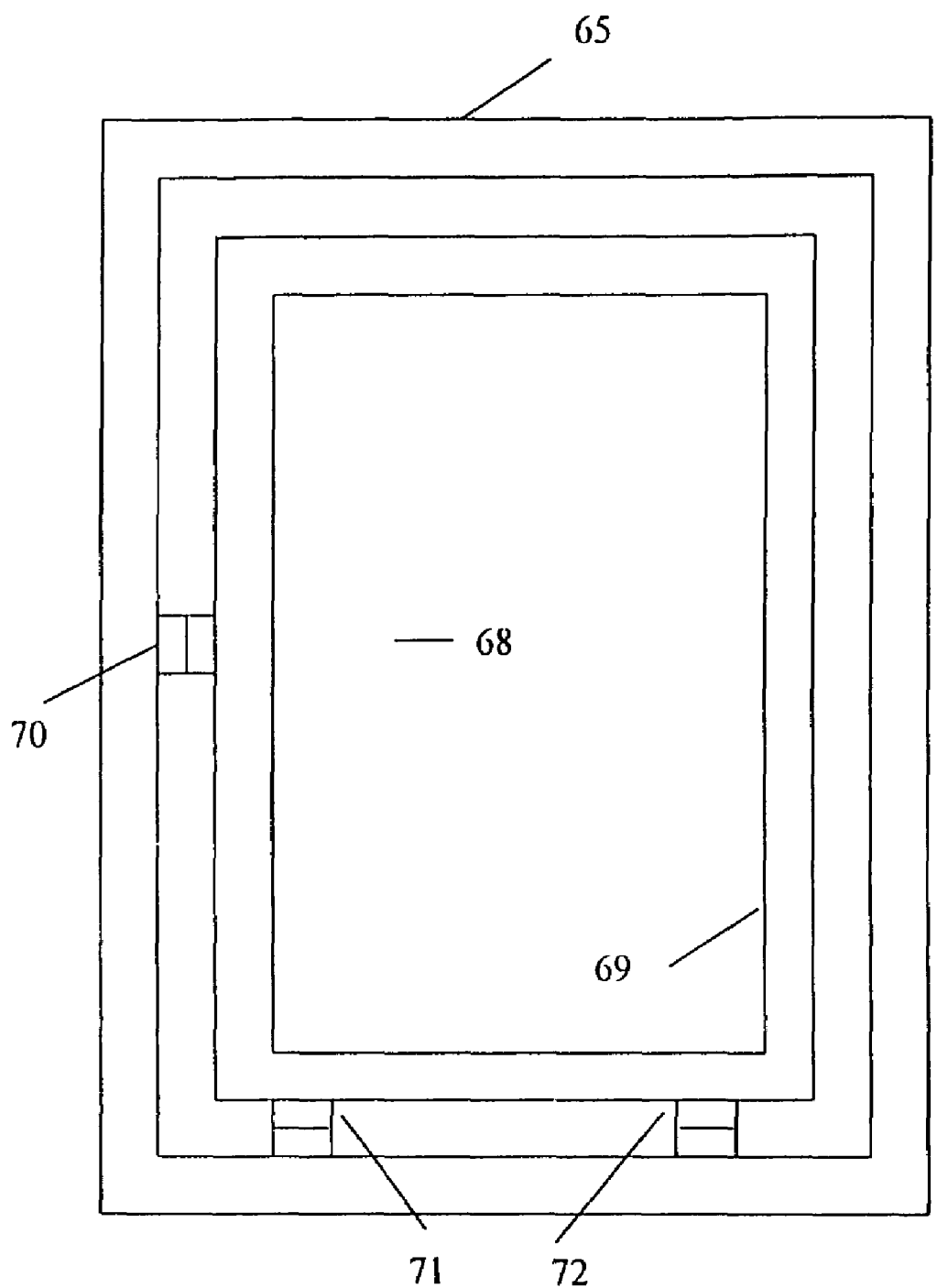
FIG. 19 is a schematic drawing of the photomask subassembly showing the position of the alignment actuators.

The photomask and platen assembly 39 carries both the photomask frame 65 and the vacuum platen 66 in one unit, which is supported on three aerostatic air/vacuum bearings 41, 42, 43. The assembly is shown, highly stylized, in FIG. 12. It requires a truss design so that it doesn't sag an unacceptable amount in the middle. Uncorrected sag causes the optical system to compensate via autofocus in order for the image to remain in sharp focus. The photomask subassembly 67 (FIG. 19) comprises a large sheet of glass or quartz carrying the master pattern 68, weighing perhaps 30 pounds, held in an outer frame 65, and within that an inner frame 69, with piezo or microstepper drivers bearing on the sides 70 or bottom 71, 72 of the inner frame. For photomasks as large as 24" and as thick as 0.75 inches, the very small sag of the mask itself, excluding the sag of the mounting frame, is easily overcome by the dynamic focussing action of the proximity autofocus gage 53 and servo lifter 51 underlying the object field. Suitable photomasks for this application are made to order by Micronic of Taby, Sweden, or by a laser writing machine of their manufacture.

Alignment gages read the position of the object at which they are pointed relative to the axis of the gage, in either X or Y (or both), and output the result as a voltage. There are a number of gages known in the art that can be employed to sense the alignment of the fiducials to a required accuracy of about 0.2 microns. Most are based upon the use of CCD sensors, for example Reticons. Others employ modulated sources and position sensitive silicon detectors (PSD's).

One good design of a PSD based position detector employs a red laser light source, modulated at approximately 10 KHz, located behind and illuminating a transparent fiducial. The image of this fiducial falls on the position sensitive silicon detector, and is synchronously demodulated using the same 10 KHz clock which modulates the source. The signal-to-noise and hence the position accuracy is further enhanced by combining a number of rapid sequential readings in a simple BASIC program. Because of the synchronous demodulation and the individual free-running 10 KHz oscillators (which, because of different components, actually run at slightly different frequencies), there is no cross-talk between gages, even when they are located close together.

The sensor or receiver portion of the gages 86 are located in the moving optical transfer assembly, with their targets 61-64, 73-76 located on the photomask and the web format respectively and with the modulated illuminators 87 located in the photomask/platen assembly.

Alignment gages are used when one is writing a second or higher layer over the first recorded pattern or layer that exists on the web. In that situation it is necessary that the subsequent patterns superpose over the base pattern accurately enough so that the functional characteristics of the circuit are maintained. In a panel this may require accuracy in superposition to around 1 micron. A plastic format plane as large as 18×24 inches is liable to severe and essentially unpredictable distortion, estimated to be as large as 1 part in $10^4$, due to humidity, heat, mechanical stretching and processing. This error can amount to 50 microns or more. The occurrence of at least 10-20 microns of distortion is expected.

The position and size of various areas of a previously written pattern must be measured immediately before each of the subsequent layers is recorded. Alignment marks or fiducials are recorded at 80 mm. intervals along both sides of the first layer when it is originally written. Similar alignment marks are included at corresponding positions on the photomasks describing the subsequent layers.

Figure 16:
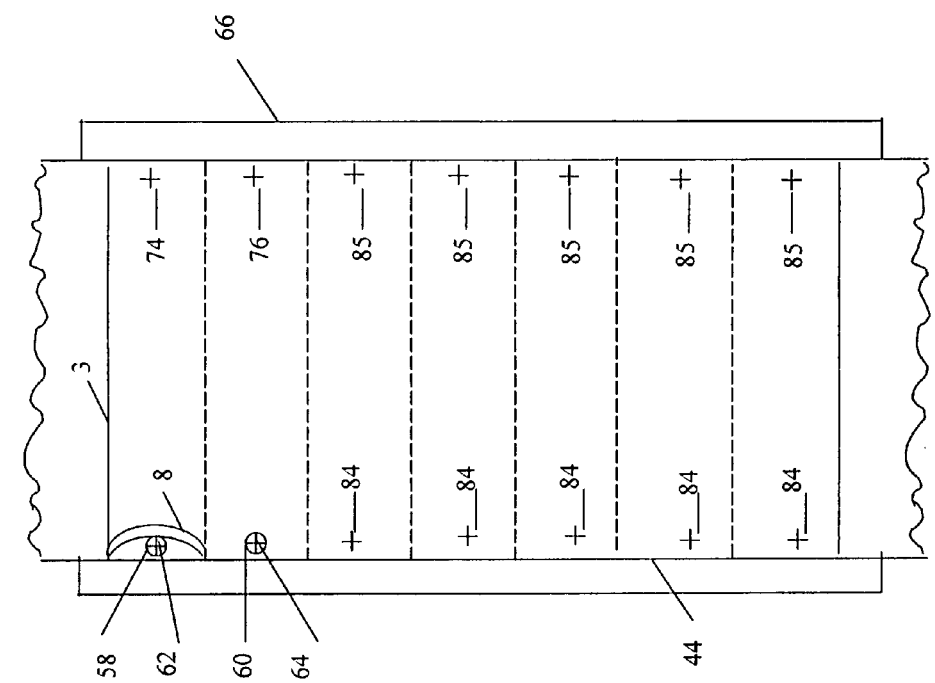
FIG. 16 is schematic drawing of the photomask subassembly and its fiducial references, in relationship to an existing format image and its fiducials on the web.
Figure 16:
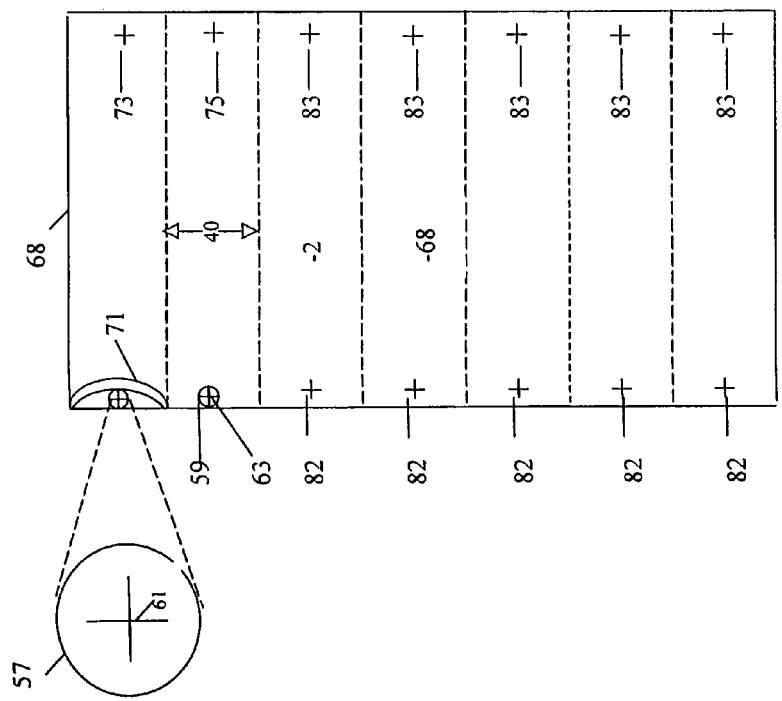

Two position sensitive gages are carried at each end of the optical transfer assembly. One gage 57 is located on the object end at the level of the center of the optical field, and another 63 is located one field width (80 mm) below it (FIG. 16). Similarly, at the image end, one gage 58 is located at the level of the center of the image field, and one gage 60 is located 80 mm. below it. Fiducial marks, which these gages use as targets, are located in corresponding positions at the left and at the right, on both the mask 61, 63, 73, 75 and on the format 62, 64, 74, 76.

When a new frame commences, the web 44 is first sucked down to the platen 47, in a nearly correct position. If this is the first layer to have been recorded upon this format, the first recording pass commences immediately after the web is sucked down. If it is a second or subsequent layer, the optical transfer assembly must make a first alignment pass, enabling the photomask/format registration and the system magnification to be adjusted to the starting registration position and distortion value, prior to recording the first exposure pass. At the start of the first pass the positions of the first four fiducials are read, at the left on the level of the middle of the object field 61, on the format at the left at the middle of the image field 62, and the two fiducials 80 mm below at the left on the mask 63 and on the format 64. These values read by the gages are remembered by the system. At the end of the first pass four more fiducials are read, those on the right at the level of the centers of the object and image fields, 73, 74 and those 80 mm. below, 75 and 76.

There is foreknowledge of the separation between the fiducial pairs 61, 63 and 63, 75 on the photomask, in both X and Y. Therefore comparison of these four known positions with the four unknown positions 62, 64, 74, 76 (comparing the positions of eight fiducials) gives a measure of the distortion that exists in both directions, X and Y, at the start of scan as well as the mask/format misalignment.

The first task is to place the upper left corner of the photomask in correct registry sideways and up and down with respect to the web, as measured by the corresponding gage on the image side. This comprises lining up the images (FIG. 16) of the top left fiducial 61 of the photomask pattern with the top left fiducial 62 of the format pattern in both X and Y and the top right fiducials 73, 74 in Y only. This maneuver requires incremental motion in both X using the Δx piezo driver 70 and Y using the two Δy piezo drivers 71, 72 (FIG. 19) which are spaced along the bottom edge of the frame. Alignment may also require a slight rotation of the photomask, which requires the two drivers 71, 72 to act in opposite directions. At the point where top left X and Y errors between 61 and 62 are removed, any difference in coincidence that may exist between the X positions of the images of the far right fiducials 73, 74 is a distortion in X which exists between the previously written format pattern and the second layer photomask. Differences that may exist at that point in both X and Y image positions (63 vs. 64 and 75 vs. 76) as observed at both the left and right lower fiducial pairs signal both an X distortion and a Y distortion.

As the optical transfer assembly passes across its track, laying down the first recorded pass of the second layer, the Δx driver element 70, acting linearly in concert, moves the photomask slightly in X, plus or minus, a total of exactly the amount of the discrepancy that the gages have measured in X between the two top right hand corner fiducials 73, 74 of the photomask and the format. The addition of this small component of X motion (Δx) insures that the image, which was exactly in registry at the start of the scan, will again be exactly in registry at the end of the scan. At the end of the recording pass the photomask/vacuum platen assembly 39 moves incrementally ahead, advancing 80 mm so that the format and photomask will be positioned correctly for the next pass, with appropriate overlap. At this point the gages can see, on both the mask and the format, the next set of fiducials, 160 mm. down the mask and the format, and from the new displacement readings can deduce the new X and Y distortion and magnification error that exists in that upcoming region of previously recorded imagery.

This process is substantially repeated on each reciprocal optical pass, except that the sense of the small Δx correction which is applied is reversed. This plus or minus Δx correction is inserted as required on each subsequent pass of the optical transfer assembly across the format. The amount of incremental Δx distance that is added varies from scan pass to scan pass, according to the X readings that have been read and remembered by the alignment gages.

Similarly, the Y direction actuators 71, 72 correct small Δy errors. Differential Δy motion increments, due to format distortion and measured at the start of the pass, are added as linear incremental motion to the photomask, within its assembly, during each cross-scan.

Since the photomask and the platen are incorporated in one assembly 39, retained by guide bearings 35, 36 which reference to the vertical face 34 of the stone base structure 33, if one is moved in Y the approximate distance of one scan width, the other moves the same distance as well. If there is sufficient distance between the two bearings 35 and 36 no yaw error will develop from this movement.

Correcting for X and Y distortion as described above places the central point of the instantaneous optical field at exactly the correct position throughout each scan and throughout the entire raster pattern, to a first approximation. However, it does not correct the recorded position of the top and bottom edges of the optical field to the degree that may be necessary. This effect can be illustrated by using (an extreme) numerical example. Suppose that the total measured Δy error from one pass to the next whose center-line was 80 mm removed was plus 8 microns, a distortion of 1 part in $10^4$. This would mean that the image was, at each extreme, minus 4 microns out at the top of the optical field position, and plus 4 microns out at the bottom of the same field. The image of the photomask object is slightly too small to correspond with the previous pattern exactly except at the center, without size correction.

A slight increase in the system magnification from one pass to the next (1 part in $10^4$) will, to a first approximation, fix this error. As explained earlier, small changes in magnification are introduced into the 1:1 reflective optical system by moving one mirror of the primary pair forward very slightly on its flex joint mounting, and the other backward. The second optical system example presented here, Table 2, has a field approximately 80 mm. in arc length, or 80,000 microns. Compensation for the −4 micron error in the numerical example above requires a system magnification increase of $\Delta M \cong 1 \times 10^{-4}$ which is accomplished by moving the first primary mirror 4 forward, shortening its conjugate distance, and moving the second primary mirror 5 backward, lengthening its conjugate distance. The optical system design is capable of more than 10 times this change without losing optical quality.

Prior to the start of each recording pass the optical system adjusts its configuration slightly as described above, moving one of the primary mirrors forward a very small amount and the other mirror backward an equal amount. This changes the magnification of the system a very small amount to reduce the upcoming Δy error.

Figure 14:
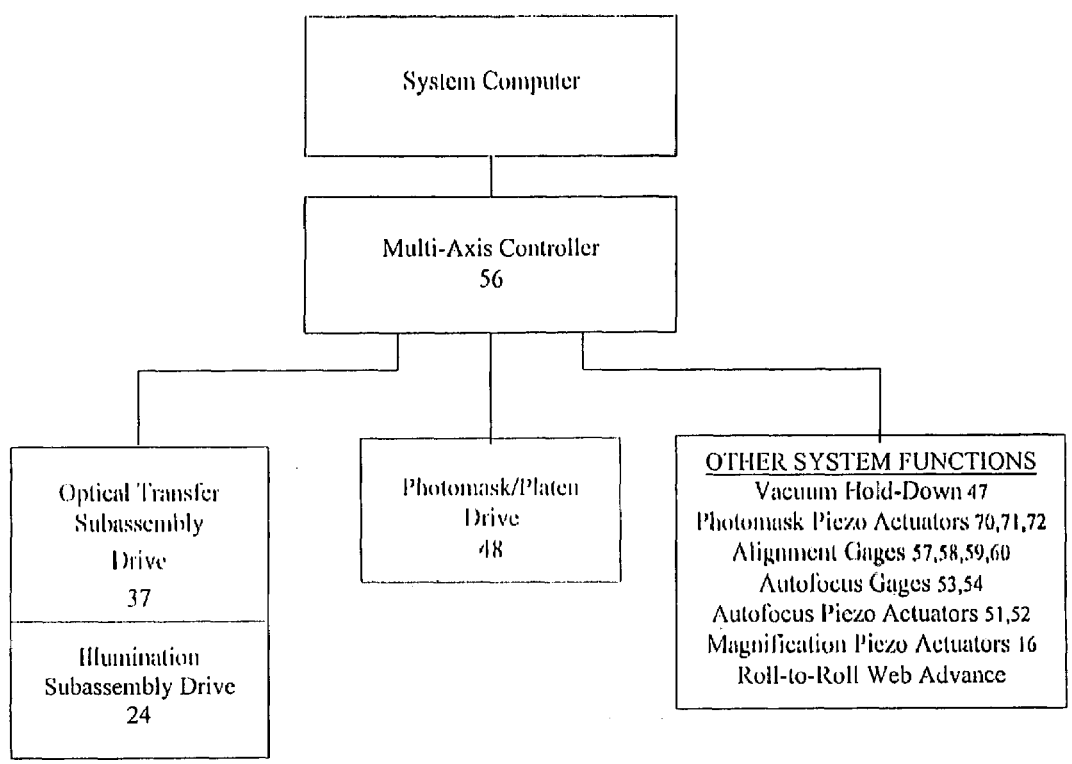
FIG. 14 is a functional block diagram of the System Controller and the Drive and Actuator functions.

The system controller 56 (FIG. 14) is a multi-axis motor controller typically made by Oregon Micro Systems. Working in conjunction with the system computer, it switches from one drive function to another as necessary to command the two drive components of the scan pattern, the piezo drivers for the photomask alignment and focus, and the web drive. This is schematically illustrated in FIG. 14.

System productivity depends upon a number of factors, e.g. operating speed, length of the flexible web and how often the system must be reloaded, the type and thickness of the photoresist or other photosensitive material. A reasonable upper limit for machine throughput would be the production of 100 18"×24" panels per hour. Assuming the use of 1000 ft. rolls of flexible material, and allowing time to change the rolls about twice per shift, leads to the requirement that the optical transfer assembly must scan the photomask and format at a speed around 15 cm/second (with appropriate allowances for overrun and turnaround times). This speed is very reasonable.

Although a number of forms and expedients have been shown and described, the invention is not limited thereto but includes all modifications and variations within the scope of the appended claims.

Appendix 1

Other References Cited

1. "Unit Magnification Optical System without Seidel Aberrations", J. Dyson, JOSA, Vol. 49, No. 7, Jul., 1959, pp. 713-716

2. U.S. Pat. No. 3,748,015, Abe Offner, dated Jul. 24, 1973, "Unit Power Imaging Catoptric Anastigmat"

3. U.S. Pat. No. 3,821,763, Roderic M. Scott, dated Jun. 28, 1974, "Annular Field Optical Imaging System"

4. U.S. Pat. No. 3,884,573, David M. Franklin, dated May 20, 1975, "Apparatus for High Resolution Projection Printing"

5. U.S. Pat. No. 3,951,546, David A. Markle, dated Apr. 20, 1976, "Three-Fold Mirror Assembly for a Scanning Projection System"

6. U.S. Pat. No. 4,011,011, Harold S. Hemstreet et al, dated Mar. 8, 1977, "Optical Projection Apparatus"

7. U.S. Pat. No. 4,068,947, Jere D. Buckley et al, dated Jan. 17, 1978, "Optical Projection and Scanning Apparatus"

8. U.S. Pat. No. 4,142,401, Gardner P. Wilson, dated Mar. 6, 1979, "Gage"

9. U.S. Pat. No. 4,171,870, John H. Bruning et al, dated Oct. 23, 1979, "Compact Image Projection Apparatus"

10. U.S. Pat. No. 4,241,390, David A. Markle, dated Dec. 23, 1980, "System for illuminating an Annular Field"

11. U.S. Pat. No. 4,549,084, David A. Markle, dated Oct. 22, 1985, "Alignment and Focusing System for a Scanning Mask Aligner"

12. U.S. Pat. No. 4,650,315, David A. Markle, dated Mar. 17, 1987, "Optical Lithographic System"

13. U.S. Pat. No. 4,779,966, Irwin Friedman, dated Oct. 25, 1988, "Single Mirror Projection Optical System"

14. U.S. Pat. No. 4,924,257, Kantilal Jam, dated May 8, 1990, "Scan and Repeat High Resolution Projection Lithography System"

15. U.S. Pat. No. 4,933,714, Jere D. Buckley et al, dated Jun. 12, 1990, "Apparatus and Method for Reproducing a Pattern in an Annular Area"

16. U.S. Pat. No. 4,953,388, Andrew H. Barada, dated Sept. 14, 1990, "Air Gauge Sensor"

17. U.S. Pat. No. 5,103,257, Roloef Wijnasendts-van-Resandt, dated Apr. 7, 1992, "Process for Producing or Inspecting Micropatterns on Large-Area Substrates"

18. U.S. Pat. No. 5,227,839, Paul C. Allen, dated Jul. 13, 1993, "Small Field Scanner"

19. U.S. Pat. No. 5,285,236, Kanti Jam, dated Feb. 8, 1994, "Large-Area High-Throughput, High-Resolution Projection Imaging System"

20. U.S. Pat. No. 5,329,332, David A. Markie et al, dated July 12, 1994, "System for Achieving a Parallel Relationship Between Surfaces of Wafer and Reticle or Half-Field Dyson Stepper"

21. "A Large Flat Panel Printer", T. R. Whitney, presented to the Society for Imaging Science and Technology 49th Annual Conference May 19-24, 1996

22. U.S. Pat. No. 5,530,516, Ronald B. Sheets, dated Jun. 25, 1996, "Large-Area Projection Exposure System"

23. U.S. Pat. No. 5,559,629, Ronald E. Sheets et al, dated Sept. 24, 1996, "Unit Magnification Projection System and Method"

24. U.S. Pat. No. 5,585,972, David A. Markle, dated Dec. 17, 1996, "Arbitrarily Wide Lens Array with an Image Field to Span the Width of a Substrate"

25. U.S. Pat. No. 5,652,645, Kanti Jam, dated July 29, 1997, "High-Throughput, High-Resolution, Projection Patterning System for Large, Flexible Roll-Fed, Electronic-Module Substrates"

26. U.S. Pat. No. 5,710,619, Kanti Jam, dated Jan. 20, 1998, "Large-Area, Scan-and-Repeat, Projection Patterning System with Unitary Stage and Magnification Control Capability"

27. U.S. Pat. No. 5,729,331, Masashi Tanaka et al, dated Mar. 17, 1998, *"Exposure Apparatus, Optical Projection Apparatus and a Method for Adjusting the Optical Projection Apparatus"*

28. U.S. Pat. No. 5,739,964, Paul C. Allen, dated Apr. 14, 1998, *"Magnification Correction for Small Field Scanning"*

29. U.S. Pat. No. 5,781,346, Paul C. Allen et al, dated Jul. 14, 1998, *"Magnification Correction for Small Field Scanning"*

30. U.S. Pat. No. 6,018,383, Thomas J. Dunn et al, dated Jan. 25, 2000, *"Very Large Area Patterning System for Flexible Substrates"*

31. U.S. Pat. No. 6,084,706, John M. Tamkin et al, dated Jul. 4, 2000, *"High Efficiency Pattern Generator"*

32. U.S. Pat. No. 6,304,315 B2, David Kessler et al, dated Oct. 16, 2001, *"High Speed High Resolution Continuous Optical Film Printer for Duplicating Motion Films"*

TABLE 1A

```
RLE
ID      ALL MIRROR SYSTEM, 1X1REFLECT.006
ID1     F/NUM 3.449, COMPLETELY OFFNER SYSTEM
ID2     ALL SPHERES
ID3     ABOUT 18 INCHES BETWEEN FIELD CENTER LINES
ID4     ARCTUATE FIELD INSTALLED AS UAP 4,
ID5     122.29 MM. ARC RADIUS. FIELD WIDTH 1 x 30 MM.
WAVL          .3650000      .4040000     .4380000
APS                         -22
GLOBAL
XPXT
UNITS MM
OBJ FINITE    -0.24140259   4.00000000   15.00000000
REF HEIGHT    -0.03500000   4.00003140   -0.03500000   15.00011774
MARGIN        1.270000
BEVEL         0.254001
 0  AIR
 1  CV                0.0000000000000    TH            0.00000000
 1  -AIR
 2  UAP              4                   8
                    15.00000000         -0.54000000
                     8.00000000          0.54000000
                    -8.00000000          0.54000000
                   -15.00000000         -0.54000000
                   -15.00000000         -1.54000000
                    -8.00000000         -0.54000000
                     8.00000000         -0.54000000
                    15.00000000         -1.54000000
 2  CV                0.0000000000000    TH            0.00000000
 2  -AIR
 3  CV                0.0000000000000    TH          -80.00000000
 3  -AIR
 4  CV                0.0000000000000    TH            0.00000000
 4  -AIR
 5  CV                0.0000000000000    TH          -59.90240000
 5  -AIR
 6  RAO             120.00000000        60.00000000  -10.00000000      0.00000000
 6  CV                0.0000000000000    TH            0.00000000
 6  AIR
 6  DECEN             0.00000000          0.00000000    0.00000000    200
 6  BT               45.00000092          0.00000000  200
 6  EFILE EX1        31.270000           31.270000    31.524000        0.000000
 6  EFILE EX2        31.270000           31.270000     0.000000
 6  EFILE MIRROR    -10.000000
 7  CV                0.0000000000000    TH            0.00000000
 7  AIR
 7  DECEN             0.00000000          0.00000000    0.00000000    200
 7  BT               45.00000092          0.00000000  200
 8  CV                0.0000000000000    TH            0.00000000
 8  AIR
 9  CV                0.0000000000000    TH            0.00000000
 9  AIR
10  CV                0.0000000000000    TH          122.29000000
10  AIR
10  DECEN             0.00000000          0.00000000    0.00000000     99
10  AT                0.00000000          0.00000000   99
11  RAO             120.00000000        120.00000000    0.00000000    -8.00000000
11  CV                0.0000000000000    TH            0.00000000
11  -AIR
11  DECEN             0.00000000          0.00000000    0.00000000    200
11  AT               45.00000107          0.00000000  200
11  EFILE EX1        61.270000           61.270000    61.524000        0.000000
11  EFILE EX2        61.270000           61.270000     0.000000
11  EFILE MIRROR    12.500000
12  CV                0.0000000000000    TH         -442.33584756
12  -AIR
12  DECEN             0.00000000          0.00000000    0.00000000    200
```

TABLE 1A-continued

| | | | | | | |
|---|---|---|---|---|---|---|
| 12 | AT | 45.00000107 | 0.00000000 | 200 | | |
| 13 | RAO | 240.00000000 | 218.00000000 | 0.00000000 | 108.00000000 | |
| 13 | CV | 0.0014062460552 | TH | 351.39880915 | | |
| 13 | AIR | | | | | |
| 13 | DECEN | 0.00000000 | −108.00000000 | 0.00000000 | 200 | |
| 13 | AT | 0.00000000 | 0.00000000 | 200 | | |
| 13 | EFILE EX1 | 110.270000 | 110.270000 | 110.270000 | 0.000000 | |
| 13 | EFILE EX2 | 110.270000 | 110.270000 | 0.000000 | | |
| 13 | EFILE MIRROR | −10.900000 | | | | |
| 14 | CV | 0.0000000000000 | TH | 0.00000000 | | |
| 14 | AIR | | | | | |
| 15 | CV | 0.0000000000000 | TH | 0.00000000 | | |
| 15 | AIR | | | | | |
| 16 | CV | 0.0000000000000 | TH | 0.00000000 | | |
| 16 | AIR | | | | | |
| 17 | CV | 0.0000000000000 | TH | 0.00000000 | | |
| 17 | AIR | | | | | |
| 18 | CV | 0.0000000000000 | TH | 0.00000000 | | |
| 18 | AIR | | | | | |
| 19 | CV | 0.0000000000000 | TH | 0.00000000 | | |
| 19 | AIR | | | | | |
| 20 | CV | 0.0000000000000 | TH | 0.00000000 | | |
| 20 | AIR | | | | | |
| 20 | DECEN | 0.00000000 | 0.00000000 | 0.00000000 | 1 | |
| 20 | GT | 90.00000000 | 0.00000000 | 1 | | |
| 21 | CV | 0.0000000000000 | TH | 0.00000000 | | |
| 21 | AIR | | | | | |
| 22 | RAD | 356.1697137266146 | TH | 0.00000000 | | |
| 22 | -AIR | | | | | |
| 22 | DC1 | 0.0000000E+00 | 0.0000000E+00 | 0.0000000E+00 | 0.0000000E+00 | 0.0000000E+00 |
| 22 | DC2 | 0.00000E+00 | 0.00000E+00 | 0.00000E+00 | 0.00000E+00 | 0.00000E+00 | 0.00000E+00 |
| 22 | DC3 | 0.00000E+00 | 0.00000E+00 | 0.00000E+00 | 0.00000E+00 | 0.00000E+00 | 0.00000E+00 |
| 22 | DECEN | 0.00000000 | 0.00000000 | 0.00000000 | 99 | |
| 22 | AT | 0.00000000 | 0.00000000 | 99 | | |
| 22 | EFILE EX1 | 49.000000 | 50.000000 | 50.000000 | 0.000000 | |
| 22 | EFILE EX2 | 49.000000 | 49.000000 | 0.000000 | | |
| 22 | EFILE MIRROR | 12.500000 | | | | |
| 23 | CV | 0.0000000000000 | TH | 0.00000000 | | |
| 23 | -AIR | | | | | |
| 23 | DECEN | 0.00000000 | 0.00000000 | 0.00000000 | 1 | |
| 23 | AT | 0.00000000 | 0.00000000 | 1 | | |
| 24 | CV | 0.0000000000000 | TH | 0.00000000 | | |
| 24 | -AIR | | | | | |
| 25 | CV | 0.0000000000000 | TH | 0.00000000 | | |
| 25 | -AIR | | | | | |
| 26 | CV | 0.0000000000000 | TH | 0.00000000 | | |
| 26 | -AIR | | | | | |
| 27 | CV | 0.0000000000000 | TH | 0.00000000 | | |
| 27 | -AIR | | | | | |
| 28 | PTH | −21 | 1.00000000 | 0.00000000 | | |
| 28 | CV | 0.0000000000000 | | | | |
| 28 | -AIR | | | | | |
| 29 | PCV | 21 | 1.00000000 | 0.00000000 | | |
| 29 | PTH | −20 | 1.00000000 | 0.00000000 | | |
| 29 | PIN | −20 | | | | |
| 29 | GID | 'PICKUP' | | | | |
| 30 | PCV | 20 | 1.00000000 | 0.00000000 | | |
| 30 | PTH | −19 | 1.00000000 | 0.00000000 | | |
| 30 | -AIR | | | | | |
| 31 | PCV | 19 | 1.00000000 | 0.00000000 | | |
| 31 | PTH | −18 | 1.00000000 | 0.00000000 | | |
| 31 | PIN | −18 | | | | |
| 31 | GID | 'PICKUP' | | | | |
| 32 | PCV | 18 | 1.00000000 | 0.00000000 | | |
| 32 | PTH | −17 | 1.00000000 | 0.00000000 | | |
| 32 | -AIR | | | | | |
| 33 | PCV | 17 | 1.00000000 | 0.00000000 | | |
| 33 | PTH | −16 | 1.00000000 | 0.00000000 | | |
| 33 | PIN | −16 | | | | |
| 33 | GID | 'PICKUP' | | | | |
| 34 | PCV | 16 | 1.00000000 | 0.00000000 | | |
| 34 | PTH | −15 | 1.00000000 | 0.00000000 | | |
| 34 | -AIR | | | | | |
| 35 | PCV | 15 | 1.00000000 | 0.00000000 | | |
| 35 | PTH | −14 | 1.00000000 | 0.00000000 | | |
| 35 | PIN | −14 | | | | |
| 35 | GID 'PICKUP' | | | | | |
| 36 | PCV | 14 | 1.00000000 | 0.00000000 | | |
| 36 | PTH | −13 | 1.00000000 | 0.00000000 | | |

TABLE 1A-continued

| | | | | | |
|---|---|---|---|---|---|
| 36 | -AIR | | | | |
| 37 | PCV | 13 | 1.00000000 | 0.00000000 | |
| 37 | RAO | 240.00000000 | 218.00000000 | 0.00000000 | −108.00000000 |
| 37 | TH | 462.33584756 | | | |
| 37 | AIR | | | | |
| 37 | EFILE EX1 | 110.270000 | 110.270000 | 110.524001 | 0.000000 |
| 37 | EFILE EX2 | 110.270000 | 110.270000 | 0.000000 | |
| 37 | EFILE MIRROR | −10.900000 | | | |
| 38 | RAO | 120.00000000 | 120.00000000 | 0.00000000 | 8.00000000 |
| 38 | CV | 0.0000000000000 | TH | 0.00000000 | |
| 38 | -AIR | | | | |
| 38 | DECEN | 0.00000000 | −108.00000000 | 0.00000000 | 200 |
| 38 | AT | 45.00000106 | 0.00000000 | 200 | |
| 38 | EFILE EX1 | 61.270000 | 61.270000 | 61.524000 | 0.000000 |
| 38 | EFILE EX2 | 61.270000 | 61.270000 | 0.000000 | |
| 38 | EFILE MIRROR | 12.500000 | | | |
| 39 | CV | 0.0000000000000 | TH | 0.00000000 | |
| 39 | -AIR | | | | |
| 39 | DECEN | 0.00000000 | 0.00000000 | 0.00000000 | 200 |
| 39 | AT | 45.00000106 | 0.00000000 | 200 | |
| 40 | CV | 0.0000000000000 | TH | 0.00000000 | |
| 40 | -AIR | | | | |
| 41 | CV | 0.0000000000000 | TH | −122.29000000 | |
| 41 | -AIR | | | | |
| 42 | RAO | 120.00000000 | 60.00000000 | −10.00000000 | 0.00000000 |
| 42 | CV | 0.0000000000000 | TH | 0.00000000 | |
| 42 | AIR | | | | |
| 42 | DECEN | 0.00000000 | 0.00000000 | 0.00000000 | 200 |
| 42 | BT | −45.00000092 | 0.00000000 | 200 | |
| 42 | EFILE EX1 | 31.270000 | 31.270000 | 31.524000 | 0.000000 |
| 42 | EFILE EX2 | 31.270000 | 31.270000 | 0.000000 | |
| 42 | EFILE MIRROR | −10.000000 | | | |
| 43 | CV | 0.0000000000000 | TH | 59.90240000 | |
| 43 | AIR | | | | |
| 43 | DECEN | 0.00000000 | 0.00000000 | 0.00000000 | 200 |
| 43 | BT | −45.00000092 | 0.00000000 | 200 | |
| 44 | CV | 0.0000000000000 | TH | 0.00000000 | |
| 44 | AIR | | | | |
| 45 | CV | 0.0000000000000 | TH | 0.00000000 | |
| 45 | AIR | | | | |
| 46 | CV | 0.0000000000000 | TH | 0.00000000 | |
| 46 | AIR | | | | |
| 47 | CV | 0.0000000000000 | TH | 0.00000000 | |
| 47 | AIR | | | | |
| 48 | CV | 0.0000000000000 | TH | 80.00000000 | |
| 48 | AIR | | | | |
| 49 | CV | 0.0000000000000 | TH | 0.24140259 | |
| 49 | AIR | | | | |
| 50 | CV | 0.0000000000000 | TH | 0.00000000 | |
| 50 | AIR | | | | |
| 51 | CV | 0.0000000000000 | TH | 0.00000000 | |
| 51 | AIR | | | | |
| END | | | | | |
| SYNOPSYS | | | | | |
| AI> | | | | | |

TABLE 2A

| | | | | |
|---|---|---|---|---|
| RLE | | | | |
| ID | PRP 20 VERSION 1.8 USING ASPHERIC | | | |
| ID1 | F/NUM 4.05 BY 4.85, FROM VERSION 1.7 | | | |
| ID2 | ASPHERIC PUPIL, ARC FIELD STOP FEATHERED | | | |
| ID3 | ABOUT 19.3 INCHES BETWEEN FIELD CENTER LINES | | | |
| ID4 | 122.0 MM. ARC RADIUS. FIELD WIDTH 4 × 80 MM. | | | |
| WAVL | .3650000 | .4040000 | .4380000 | |
| APS | −21 | | | |
| GLOBAL | | | | |
| XPXT | | | | |
| EPUPIL | | | | |
| NOVIG | | | | |
| UNITS MM | | | | |
| OBJ FINITE | −0.24140259 | 2.00000000 | 40.00000000 | |
| REF HEIGHT | −0.02500000 | 2.00002315 | −0.03000000 | 40.00046302 |
| MARGIN | 1.270000 | | | |
| BEVEL | 0.254001 | | | |
| 0 | AIR | | | |

TABLE 2A-continued

| | | | | | |
|---|---|---|---|---|---|
| 1 | CAO | 124.00000000 | 0.00000000 | −122.00000000 | |
| 1 | CAI | 120.00000000 | 0.00000000 | −122.00000000 | |
| 1 | CV | 0.0000000000000 | TH | 0.00000000 | |
| 1 | -AIR | | | | |
| 2 | UAP | 4 | 4 | | |
| | | 40.10000000 | 2.10000000 | | |
| | | 40.10000000 | −4.70000000 | | |
| | | −40.10000000 | −4.70000000 | | |
| | | −40.10000000 | 2.10000000 | | |
| 2 | CV | 0.0000000000000 | TH | −136.06343000 | |
| 2 | -AIR | | | | |
| 3 | RAO | 180.00000000 | 60.00000000 | 10.00000000 | 0.00000000 |
| 3 | CV | 0.0000000000000 | TH | 0.00000000 | |
| 3 | AIR | | | | |
| 3 | DECEN | 0.00000000 | 0.00000000 | 0.00000000 | 200 |
| 3 | BT | −45.00000055 | 0.00000000 | 200 | |
| 3 | EFILE EX1 | 31.270000 | 31.270000 | 31.524000 | 0.000000 |
| 3 | EFILE EX2 | 31.270000 | 31.270000 | 0.000000 | |
| 3 | EFILE MIRROR | −10.000000 | | | |
| 4 | CV | 0.0000000000000 | TH | 113.83900000 | |
| 4 | AIR | | | | |
| 4 | DECEN | 0.00000000 | 0.00000000 | 0.00000000 | 200 |
| 4 | BT | −45.00000055 | 0.00000000 | 200 | |
| 5 | RAO | 155.00010000 | 95.00000000 | 0.00000000 | −5.00000000 |
| 5 | CV | 0.0000000000000 | TH | 0.00000000 | |
| 5 | -AIR | | | | |
| 5 | DECEN | 0.00000000 | 0.00000000 | 0.00000000 | 200 |
| 5 | AT | 45.00000161 | 0.00000000 | 200 | |
| 5 | EFILE EX1 | 48.770000 | 48.770000 | 49.024000 | 0.000000 |
| 5 | EFILE EX2 | 48.770000 | 48.770000 | 0.000000 | |
| 5 | EFILE MIRROR | 10.000000 | | | |
| 6 | CV | 0.0000000000000 | TH | 0.00000000 | |
| 6 | -AIR | | | | |
| 6 | DECEN | 0.00000000 | 0.00000000 | 0.00000000 | 200 |
| 6 | AT | 45.00000161 | 0.00000000 | 200 | |
| 7 | CV | 0.0000000000000 | TH | 0.00000000 | |
| 7 | -AIR | | | | |
| 8 | CV | 0.0000000000000 | TH | 0.00000000 | |
| 8 | -AIR | | | | |
| 9 | CV | 0.0000000000000 | TH | −96.27020000 | |
| 9 | -AIR | | | | |
| 10 | RAO | 190.00020000 | 130.00000000 | 0.00000000 | −5.00000000 |
| 10 | CV | 0.0000000000000 | TH | 0.00000000 | |
| 10 | AIR | | | | |
| 10 | DECEN | 0.00000000 | 0.00000000 | 0.00000000 | 200 |
| 10 | AT | −45.00000176 | 0.00000000 | 200 | |
| 10 | EFILE EX1 | 66.270000 | 66.270000 | 66.524000 | 0.000000 |
| 10 | EFILE EX2 | 66.270000 | 66.270000 | 0.000000 | |
| 10 | EFILE MIRROR | −10.000000 | | | |
| 11 | CV | 0.0000000000000 | TH | 340.18700000 | |
| 11 | AIR | | | | |
| 11 | DECEN | 0.00000000 | 0.00000000 | 0.00000000 | 200 |
| 11 | AT | −45.00000176 | 0.00000000 | 200 | |
| 12 | RAD | 255.00000000 | 170.00000000 | 0.00000000 | 122.00000000 |
| 12 | CV | −0.0014660357817 | TH | −335.38433884 | |
| 12 | -AIR | | | | |
| 12 | DECEN | 0.00000000 | −122.00000000 | 0.00000000 | 200 |
| 12 | AT | 0.00000000 | 0.00000000 | 200 | |
| 12 | EFILE EX1 | 86.270000 | 86.270000 | 86.524001 | 0.000000 |
| 12 | EFILE EX2 | 86.270000 | 86.270000 | 0.000000 | |
| 12 | EFILE MIRROR | 8.500000 | | | |
| 13 | CV | 0.0000000000000 | TH | 0.00000000 | |
| 13 | -AIR | | | | |
| 14 | CV | 0.0000000000000 | TH | 0.00000000 | |
| 14 | -AIR | | | | |
| 15 | CV | 0.0000000000000 | TH | 0.00000000 | |
| 15 | -AIR | | | | |
| 16 | CV | 0.0000000000000 | TH | 0.00000000 | |
| 16 | -AIR | | | | |
| 17 | CV | 0.0000000000000 | TH | 0.00000000 | |
| 17 | -AIR | | | | |
| 18 | CV | 0.0000000000000 | TH | 0.00000000 | |
| 18 | -AIR | | | | |
| 19 | CV | 0.0000000000000 | TH | 0.00000000 | |
| 19 | -AIR | | | | |

TABLE 2A-continued

| | | | | | | |
|---|---|---|---|---|---|---|
| 19 | DECEN | 0.00000000 | 0.00000000 | 0.00000000 | 1 | |
| 19 | GT | −90.00000086 | 0.00000000 | 1 | | |
| 20 | CV | 0.0000000000000 | TH | 0.00000000 | | |
| 20 | -AIR | | | | | |
| 21 | RAD | −384.3771101406386 | TH | 0.00000000 | | |
| 21 | CC | −0.95921965 | | | | |
| 21 | AIR | | | | | |
| 21 | DC1 | −1.6015744E−04 | −3.0107985E−09 | −3.9049472E−14 | 1.4301874E−17 | −2.6293285E−21 |
| 21 | DC2 | 0.00000E+00 | 0.00000E+00 | 0.00000E+00 | 0.00000E+00 | 0.00000E+00 | 0.00000E+00 |
| 21 | DC3 | 0.00000E+00 | 0.00000E+00 | 0.00000E+00 | 0.00000E+00 | 0.00000E+00 | 0.00000E+00 |
| 21 | DECEN | 0.00000000 | 0.00000000 | 0.00000000 | 99 | |
| 21 | AT | 0.00000000 | 0.00000000 | 99 | | |
| 21 | EFILE EX1 | 49.000000 | 50.000000 | 50.000000 | 0.000000 | |
| 21 | EFILE EX2 | 49.000000 | 49.000000 | 0.000000 | | |
| 21 | EFILE MIRROR | −12.500000 | | | | |
| 22 | CV | 0.0000000000000 | TH | 0.00000000 | | |
| 22 | AIR | | | | | |
| 22 | DECEN | 0.00000000 | 0.00000000 | 0.00000000 | 1 | |
| 22 | AT | 0.00000000 | 0.00000000 | 1 | | |
| 23 | CV | 0.0000000000000 | TH | 0.00000000 | | |
| 23 | AIR | | | | | |
| 24 | CV | 0.0000000000000 | TH | 0.00000000 | | |
| 24 | AIR | | | | | |
| 25 | CV | 0.0000000000000 | TH | 0.00000000 | | |
| 25 | AIR | | | | | |
| 26 | CV | 0.0000000000000 | TH | 0.00000000 | | |
| 26 | AIR | | | | | |
| 27 | PTH | −20 | 1.00000000 | 0.00000000 | | |
| 27 | CV | 0.0000000000000 | | | | |
| 27 | AIR | | | | | |
| 28 | PCV | 20 | 1.00000000 | 0.00000000 | | |
| 28 | PTH | −19 | 1.00000000 | 0.00000000 | | |
| 28 | PIN | −19 | | | | |
| 28 | GID | 'PICKUP' | | | | |
| 29 | PCV | 19 | 1.00000000 | 0.00000000 | | |
| 29 | PTH | −18 | 1.00000000 | 0.00000000 | | |
| 29 | AIR | | | | | |
| 30 | PCV | 18 | 1.00000000 | 0.00000000 | | |
| 30 | PTH | −17 | 1.00000000 | 0.00000000 | | |
| 30 | PIN | −17 | | | | |
| 30 | GID | 'PICKUP' | | | | |
| 31 | PCV | 17 | 1.00000000 | 0.00000000 | | |
| 31 | PTH | −16 | 1.00000000 | 0.00000000 | | |
| 31 | AIR | | | | | |
| 32 | PCV | 16 | 1.00000000 | 0.00000000 | | |
| 32 | PTH | −15 | 1.00000000 | 0.00000000 | | |
| 32 | PIN | −15 | | | | |
| 32 | GID | 'PICKUP' | | | | |
| 33 | PCV | 15 | 1.00000000 | 0.00000000 | | |
| 33 | PTH | −14 | 1.00000000 | 0.00000000 | | |
| 33 | AIR | | | | | |
| 34 | PCV | 14 | 1.00000000 | 0.00000000 | | |
| 34 | PTH | −13 | 1.00000000 | 0.00000000 | | |
| 34 | PIN | −13 | | | | |
| 34 | GID | 'PICKUP' | | | | |
| 35 | PCV | 13 | 1.00000000 | 0.00000000 | | |
| 35 | PTH | −12 | 1.00000000 | 0.00000000 | | |
| 35 | AIR | | | | | |
| 36 | PCV | 12 | 1.00000000 | 0.00000000 | | |
| 36 | RAO | 255.00000000 | 170.00000000 | 0.00000000 | −122.00000000 | |
| 36 | TH | −331.26900000 | | | | |
| 36 | -AIR | | | | | |
| 36 | EFILE EX1 | 86.270000 | 86.270000 | 86.524001 | 0.000000 | |
| 36 | EFILE EX2 | 86.270000 | 86.270000 | 0.000000 | | |
| 36 | EFILE MIRROR | 8.500000 | | | | |
| 37 | RAO | 190.00020000 | 130.00000000 | 0.00000000 | 0.00000000 | |
| 37 | CV | 0.0000000000000 | TH | 0.00000000 | | |
| 37 | AIR | | | | | |
| 37 | DECEN | 0.00000000 | −122.00000000 | 0.00000000 | 200 | |
| 37 | AT | −45.00000175 | 0.00000000 | 200 | | |
| 37 | EFILE EX1 | 66.270000 | 66.270000 | 66.524000 | 0.000000 | |
| 37 | EFILE EX2 | 66.270000 | 66.270000 | 0.000000 | | |
| 37 | EFILE MIRROR | −10.000000 | | | | |
| 38 | CV | 0.0000000000000 | TH | 92.89800000 | | |
| 38 | AIR | | | | | |
| 38 | DECEN | 0.00000000 | 0.00000000 | 0.00000000 | 200 | |

TABLE 2A-continued

| | | | | | |
|---|---|---|---|---|---|
| 38 | AT | -45.00000175 | 0.00000000 | 200 | |
| 39 | CV | 0.0000000000000 | TH | 0.00000000 | |
| 39 | AIR | | | | |
| 40 | CV | 0.0000000000000 | TH | 182.19200000 | |
| 40 | AIR | | | | |
| 41 | CV | 0.0000000000000 | TH | 0.00000000 | |
| 41 | AIR | | | | |
| 42 | CV | 0.0000000000000 | TH | 0.00000000 | |
| 42 | AIR | | | | |
| 43 | CV | 0.0000000000000 | TH | 0.00000000 | |
| 43 | AIR | | | | |
| 44 | CV | 0.0000000000000 | TH | 0.00000000 | |
| 44 | AIR | | | | |
| 45 | CV | 0.0000000000000 | TH | 80.00000000 | |
| 45 | AIR | | | | |
| 46 | CV | 0.0000000000000 | TH | -220.69057000 | |
| 46 | AIR | | | | |
| 47 | RAO | 169.99965000 | 95.00000000 | 0.00000000 | -5.00000000 |
| 47 | CV | 0.0000000000000 | TH | 0.00000000 | |
| 47 | -AIR | | | | |
| 47 | DECEN | 0.00000000 | 0.00000000 | 0.00000000 | 200 |
| 47 | AT | -45.00000055 | 0.00000000 | 200 | |
| 47 | EFILE EX1 | 48.770000 | 48.770000 | 49.024000 | 0.000000 |
| 47 | EFILE EX2 | 48.770000 | 48.770000 | 0.000000 | |
| 47 | EFILE MIRROR | 10.000000 | | | |
| 48 | CV | 0.0000000000000 | TH | -230.93400000 | |
| 48 | -AIR | | | | |
| 48 | DECEN | 0.00000000 | 0.00000000 | 0.00000000 | 200 |
| 48 | AT | -45.00000055 | 0.00000000 | 200 | |
| 49 | CV | 0.0000000000000 | TH | 146.06200000 | |
| 49 | -AIR | | | | |
| 50 | RAO | 190.00020000 | 60.00000000 | 12.50000000 | 5.30000000E-09 |
| 50 | CV | 0.0000000000000 | TH | 0.00000000 | |
| 50 | AIR | | | | |
| 50 | DECEN | 0.00000000 | 0.00000000 | 0.00000000 | 200 |
| 50 | BT | 45.00000052 | 0.00000000 | 200 | |
| 50 | EFILE EX1 | 31.270000 | 31.270000 | 31.524000 | 0.000000 |
| 50 | EFILE EX2 | 31.270000 | 31.270000 | 0.000000 | |
| 50 | EFILE MIRROR | -10.000000 | | | |
| 51 | CV | 0.0000000000000 | TH | 136.06343000 | |
| 51 | AIR | | | | |
| 51 | DECEN | 0.00000000 | 0.00000000 | 0.00000000 | 200 |
| 51 | BT | 45.00000052 | 0.00000000 | 200 | |
| 52 | CV | 0.0000000000000 | TH | 0.00000000 | |
| 52 | AIR | | | | |

The invention claimed is:

1. A reflecting optical system for transferring an image from an object plane to an image plane at nearly unit magnification, comprising a first concave mirror, a convex mirror and a second concave mirror in series, the concave mirrors being spherical, of the same curvature, sharing approximately the same centers and being movable under control with respect to each other for the purpose of introducing a change in magnification up to at least plus or minus one part in one thousand.

2. A reflecting optical system according to claim 1 fitted with a mechanism for moving the two concave mirrors in opposing directions aligned to the axis of the convex mirror in response to driver signals to change the system magnification.

3. A reflecting optical system according to claim 1 wherein the convex mirror is spherical.

4. A reflecting optical system according to claim 1 wherein the convex mirror is aspherical.

5. A reflecting optical system according to claim 1, fitted near to the object plane with an arctuate field stop, the common center of the arcs comprising the sides of the stop lying on the axis of the convex mirror, in order to admit through the reflecting optical system the arc of rays comprising best imagery.

6. A reflecting optical system according to claim 1 fitted at the object side with two orthogonally placed flat mirrors and at the image side with two orthogonally placed flat mirrors, for inversion and reversion of the image, the system of flat mirrors combining with the inversion and reversion of the curved reflecting mirrors to produce an erect image.

7. A reflecting optical system according to claim 1 fitted at the object side with three orthogonally placed flat mirrors and fitted at the image side with three more orthogonally placed flat mirrors, the system of flat mirrors combining with the inversion and reversion of the first concave, convex and second concave curved reflecting mirrors to produce an erect image and in addition to rotate the arc of rays comprising best imagery by 90 degrees.

8. A reflecting optical system according to claim 1, where the system of flat mirrors is arranged to substantially increase the distance between the center of the object plane and the center of the image plane.

* * * * *